United States Patent
Engelsberg et al.

[11] Patent Number: 5,958,268
[45] Date of Patent: Sep. 28, 1999

[54] REMOVAL OF MATERIAL BY POLARIZED RADIATION

[75] Inventors: Audrey C. Engelsberg, Milton; William P. Parker, Waitsfield, both of Vt.

[73] Assignee: Cauldron Limited Partnership, Bethesda, Md.

[21] Appl. No.: 08/609,449

[22] Filed: Mar. 1, 1996

Related U.S. Application Data

[62] Division of application No. 08/472,762, Jun. 7, 1995, abandoned.

[51] Int. Cl.$^6$ .................................................. B23K 26/14
[52] U.S. Cl. .............................. 219/121.84; 219/121.85; 134/1
[58] Field of Search .................. 219/121.68, 121.69, 219/121.72, 121.84, 121.85; 134/1, 1.3; 216/65, 94; 437/173; 156/643.1; 264/400

[56] References Cited

U.S. PATENT DOCUMENTS

| | | | |
|---|---|---|---|
| Re. 33,777 | 12/1991 | Woodroffe | 134/1 |
| 4,368,080 | 1/1983 | Langen et al. | 134/1 |
| 4,752,455 | 6/1988 | Mayer . | |
| 4,784,135 | 11/1988 | Blum et al. . | |
| 4,908,493 | 3/1990 | Susemihl | 219/121.72 X |
| 4,980,536 | 12/1990 | Asch et al. | 219/121.68 |
| 4,987,286 | 1/1991 | Allen . | |
| 5,023,424 | 6/1991 | Vaught | 219/121.69 X |
| 5,024,968 | 6/1991 | Engelsberg . | |
| 5,068,750 | 11/1991 | Cook et al. | 134/1 X |
| 5,099,557 | 3/1992 | Engelsberg . | |
| 5,114,834 | 5/1992 | Nachshon | 216/65 X |
| 5,151,134 | 9/1992 | Boquillon et al. . | |
| 5,151,135 | 9/1992 | Magee et al. . | |
| 5,228,206 | 7/1993 | Grant et al. . | |
| 5,373,140 | 12/1994 | Nagy et al. . | |
| 5,482,561 | 1/1996 | Yeung et al. | 134/1 |
| 5,499,668 | 3/1996 | Katayama et al. | 134/1 |
| 5,531,857 | 7/1996 | Engelsberg et al. | 134/1 X |
| 5,592,879 | 1/1997 | Waizmann | 134/1 X |

FOREIGN PATENT DOCUMENTS

| | | |
|---|---|---|
| 0 091 646 | 10/1983 | European Pat. Off. . |
| 111060 | 6/1984 | European Pat. Off. . |
| 350021 | 1/1990 | European Pat. Off. . |
| 2671430 | 7/1992 | France . |
| 4-288988 | 10/1992 | Japan .............................. 219/121.85 |
| 51 66784 | 7/1993 | Japan . |
| 83/01400 | 4/1983 | WIPO . |

OTHER PUBLICATIONS

"Damage–free Laser Ablation Removal of Organic Materials," IBM Technical Disclosure Bulletin, vol. 37, No. 10, p. 453, Oct. 1994.

Tanabe, et al., "Polarization Dependence of Electric Field Intensity Distributions in Photoresist Films," Jpn. J. Appl. Phys. vol. 33, Pt 1, No. 128, 1994.

von Allmen, et al., "Absorption of Laser Light," von Allmen, M., et al., *Laser–Beam Interactions with Materials*, 2nd ed., Springer, 1995, pp. 5–17.

Grill, W., et al, "Excitation of Coherent and Incoherent Terahertz Phonon Pulses in Quartz Using Infrared Laser Radiation," *Physical Review Letters,* vol. 35, No. 9, pp. 588–591, Sep. 1, 1975.

(List continued on next page.)

*Primary Examiner*—Gregory L. Mills
*Attorney, Agent, or Firm*—Morgan, Lewis & Bockius LLP; C. Scott Talbot; Robert J. Goodell

[57] ABSTRACT

An apparatus and method for selectively removing undesired material from the surface of a substrate provides a flow of inert gas over the undesired material substrate surface while irradiating the undesired material with energetic photons. The invention enables removal of undesired material without altering the physical properties of the material underlying or adjacent the removed, undesired material. Removal effectiveness may be enhanced by utilizing polarized energetic photons. Directing a laser beam to the back side of a transparent substrate may enhance the effectiveness of removal.

18 Claims, 6 Drawing Sheets

OTHER PUBLICATIONS

Vig, J., "UV/Ozone Cleaning of Surfaces," *J. Vac. Sci. Technol. A*, vol. 3, No. 3, pp. 1027–1034, May/Jun. 1985.

Dulcey, C., et al., "Deep UV Photochemistry of Chemisorbed Monolayers: Patterned Coplanar Molecular Assemblies," *Science*, vol. 252, Reports, pp. 551–554, Apr. 26, 1991.

Van Eck, B., et al., "Vapor Phase Etching and Cleaning of $SiO_2$," Microcontamination Conference Proceedings, pp. 694–705.

deLarios, J., et al., "Gas–Phase Cleaning of Trace Metal and Organic Contaminants From Wafers: Ultraviolet Irradiated Oxygen–Based and Chlorine–Based Chemistries,"Microcontamination Conference Proceedings, pp. 706–717.

Miyashita, M., et al., "Dependence of Surface Microroughness of CZ, FZ, and EPI Wafers on Wet Chemical Processing," *J. Electrochem. Soc.*, vol. 139, No. 8, pp. 2,133–2,142, Aug. 1992.

McClelland, J., "Laser–Focused Atomic Deposition," *Science*, vol. 262, pp. 877–880, Nov. 5, 1993.

Bryzek, J., et al., "Micromachines on the March," *IEEE Spectrum*, pp. 20–31, May 1994.

Weis, O., "Surface Excitation of Hypersound in Piezoelectric Crystals by Plane Electromagnetic Waves," *Z. Physik*, B 21, Nos. 1–10, Feb. 14, 1975.

Engelsberg, A., "Particle Removal from Semiconductor Surfaces Using a Photon–Assisted, Gas–Phase Cleaning Process," *Materials Research Society Symposium Proceedings*, vol. 315, pp. 254–260, 1993.

Burggraaf, P., "Thin Film Metrology: Headed for a New Plateau," *Semiconductor International*, pp. 56–60, Mar. 1994.

Barna, G., et al., "Dry Etch Processes and Sensors," *Solid State Technology*, pp. 47–53, Jan. 1994.

Ohmi, T., "ULSI Reliability Through Ultraclean Processing," *Proceedings of the IEEE*, vol. 81, No. 5, pp. 716–729, May 1993.

Lu, Y., et al., "Laser Cleaning –A New Surface Cleaning Method Without Pollutions," *Mat. Res. Soc. Symp. Proc.*, vol. 334, pp. 329–334, 1994.

Lu, Y., et al., "Laser–Induced Dry Cleaning in Air —A New Surface Cleaning Technology in Lieu of Carbon Fluorochloride (CFC) Solvents," *Jpn. J. Appl. Phys.*, vol. 33, Part 2, No. 3B, pp. L430–L433, Mar. 15, 1994.

Lu, Y., et al., "Laser–Induced Removal of Fingerprints From Glass and Quartz Surfaces," *Jpn. J. Appl. Phy.*, vol. 33, Pt. 1, No. 8, pp. 4,691–4696, 1994.

Lu, Y., et al., "Excimer–Laser Removal of $SiO_2$ Patterns From GaAs Substrates," *Jpn. J. Appl. Phys. Letters*, vol. 33, Pt. 2, No. 3A, pp. L324–L327, Mar. 1, 1994.

Bollinger, L., et al., "Plasma Process Integration for Large Wafer Manufacturing,"Advanced Semiconductor Manufacturing Conference, Nov. 14, 1994.

Lu, Y., et al., "Laser Surface Cleaning in Air: Mechanisms and Applications," *Jpn. J. Appl. Phys.*, vol. 33, Pt. 1, No. 12B, pp. 7138–7143, Dec. 1994.

Shen, Y., Laser Manipulation of Particles, *The Principles of Nonlinear Optics*, Chap. 20, pp. 366–378, 1984.

Magee, T., et al., "Technology Disclosure: UV Laser Cleaning of Semiconductor Surfaces," XMR Inc., Santa Clara, CA. No date available.

Engelsberg, A., "Laser–Assisted Cleaning Proves Promising," *Precision Cleaning*, Reprint, May 1995.

Lu, Y., et al., "Excimer Laser Applications in Integrated Circuit Packaging," to be published in *Proceedings Of The Materials Research Soc.*, vol. 397, Spring, 1996.

Lu, Y., et al., "Laser Dry Cleaning of $ZrO_2$ Particles From Air Bearing Surface of Magnetic Head Sliders," to be published in *Proceedings Of The Materials Research Soc.*, vol. 397, Spring, 1996.

REMOVAL OF MATERIAL BY POLARIZED RADIATION

This application is a Division of U.S. patent application Ser. No. 08/472,762, filed Jun. 7, 1995, now abandoned. The following commonly assigned applications and patents are related hereto and their disclosures are incorporated by reference: U.S. patent application Ser. No. 08/306,431, filed Sep. 19, 1994 (referred to herein as the "parent application"), now U.S. Pat. No. 5,643,472; U.S. patent application Ser. No. 08/045,165, filed Apr. 12, 1993 (referred to herein as the "'165 application"), now abandoned; U.S. patent application Ser. No. 07/865,039 filed Mar. 31, 1992 (referred to herein as the "'039 application"), now abandoned; U.S. patent application Ser. No. 07/611,198, filed Nov. 9, 1990, now U.S. Pat. No. 5,099,557 (the "'557 patent"); and U.S. patent application Ser. No. 07/216,903, filed Jul. 8, 1988, now U.S. Pat. No. 5,024,968 (the "'968 patent").

BACKGROUND OF THE INVENTION

This invention relates to removing material from a surface. More particularly, the invention relates to the selective removal of material from the surface of a substrate by irradiation without altering the physical properties of material to be left on the substrate that is underlying or adjacent to the material to be removed.

Effective removal of undesired material from the surface of a substrate is a critical aspect of many important materials processing and product fabrication processes. As described in the '165 application, undesired materials (which may also be considered as contaminants) include particles, unwanted chemical elements or compounds, and films or layers of material. Particles may be discrete pieces of matter ranging in size from submicrons to granules visible to the unaided eye. Undesired chemicals include any element or compound which, at the time at which the removal process is performed, is undesirable. For example, hydroxyl groups (—OH) may be a desired reaction promoter on the surface of a substrate at one stage of a process and may be an undesired contaminant at another stage. Films or layers of material may be organic, such as human body oil from fingerprints, paint, and epoxy, or inorganic, such as oxides of the substrate material or other inorganic materials to which the substrate has been exposed.

Such undesired materials may need to be removed to render the substrate more useful for its intended purpose. For example, in certain precise scientific measurement devices, accuracy is lost when optical lenses or mirrors in the devices become coated with microfine surface contaminants. Similarly in semiconductors, surface defects due to minor molecular contaminants often render semiconductor masks or chips worthless. Reducing the number of molecular surface defects in a quartz semiconductor mask by even a small amount can radically improve semiconductor chip production yields. Similarly, removing molecular surface contaminants, such as carbon or oxygen, from the surface of silicon wafers before circuit layers are deposited on the wafer or between deposition of layers significantly improves the quality of the computer chip produced.

Selective removal of layers of the substrate material may be done to form very small-scale structures on the substrate surface (so-called "nanostructures"). Material (whether substrate material, oxide layers, or other layers of material) may also be selectively removed in differing amounts across the surface of the substrate to changes the surface topography of the substrate (such as smoothing a rough surface).

Material processing equipment often requires treatment for removal of undesired material to prevent contamination of products processed by the equipment. For example, a significant portion of the undesired material that ultimately contaminates silicon wafers during production emanates from production apparatus such as process chambers in which the wafers are placed, quartz wafer boats used to hold wafers for passage through quartz furnace tubes (and the furnace tubes themselves), and pipes that conduct processing gas to the chambers. Accordingly, the level of wafer contamination experienced during the course of production can be significantly reduced by the periodic cleaning of such apparatus.

In general, any process used for removing material from a substrate should do so without affecting the physical properties of the (desired) material that remains. The physical properties that should remain unaffected can in general include crystalline structure, conductivity, density, dielectric constant, charge density, Hall coefficient, and diffusion coefficient for electrons/holes. In particular semiconductor applications (such as metal oxide semiconductor ("MOS"); field effect transistor ("FET"); and bipolar junction ("BJT")), the properties can include capacitance/area in MOS; junction capacitance; channel current in an FET, directed from drain to source; voltage from collector to base, emitter to base in a BJT; voltage from drain to source, gate to source in an FET; MOS threshold potential; MOS surface state charge/area; and storage delay time. Further, it may be undesirable to change the topography (such as the surface roughness) of the remaining material.

As described in detail in the '165 application, many techniques have been proposed (and are currently used) for removing undesired materials. These include wet chemical cleaning (RCA process), dilute HF, megasonic and ultrasonic, and supercritical fluid cleaning, UV and ozone cleaning, brush cleaning, vapor HF, laser-assisted liquid cleaning (including the Allen process and Tam process), surface melt, annealing, and ablation.

Another technique is plasma cleaning, which may be used to clean the process chambers of reactive ion etch (RIE) tools after a certain amount of processing (e.g. a certain number of wafers) is completed. The preferred plasma species are oxygen, carbon tetrachloride, and nitrogen, which can be used in various mass molar concentrations for cleaning optics and silicon surfaces. Electron cyclotron resonance (ECR) based plasmas are currently state of the art. The effectiveness of this type of cleaning is limited to particles—film removal appears to be difficult and damaging to the electrical parametrics.

Dry ice ($CO_2$) cleaning (also known as snow cleaning and $CO_2$ jet spray cleaning) is a method of delivering $CO_2$ snow via a hand-held device having various orifices to clean a surface. This technique is limited by the solubility of the particle in the $CO_2$ snow, e.g. if the particle is not soluble in $CO_2$ then it will not be removed from the surface. Further, oxides and polymeric films cannot be removed using this cleaning technique.

All of these techniques suffer from some drawbacks, including: inability to remove very small particles; undesirable alteration of the underlying substrate's physical properties; consumption of large quantities of expensive materials such as ultrapure water and gases; and production of toxic waste products (such as HF acids).

Films, and in particular oxidation films, are a common, troublesome category of materials that need to be removed from a substrate. Most materials that are exposed to an oxygenated atmosphere (e.g., air) form a native oxide that coats the surface. Such oxide layers are typically a substantially continuous layer of molecules of the oxide material. In most cases, this native oxide layer is detrimental depending on how the substrate material will be used. One approach to this problem has been to maintain the substrate material in a vacuum to prevent oxide growth. Known techniques for removing oxide films include treating them with strong acids such as aqua regia, sulfuric acid and hydrofluoric acid.

In semiconductor fabrication, the removal of native oxide (silicon dioxide) from the silicon substrate is of great concern as technology geometries continue to get smaller. Current methods to remove the silicon dioxide employ liquid HF, and experiments are being undertaken with vapor phase halogens and vapor phase halogens in conjunction with UV radiation. B. Van Eck, S. Bhat, and V. Menon, "Vapor-phase etching and cleaning of $SiO_2$," *Proceedings, Microcontamination* 92, (Santa Clara, Calif.; Oct. 27–30, 1992), p. 694; J. de Larios, W. Krusell, D. McKean, G. Smolinsky, B. Doris, and M. Gordon, "Gas-phase cleaning of trace metal and organic contaminants from wafers: Ultraviolet irradiated oxygen-based and chlorine-based chemistries," *Proceedings, Microcontamination* 92, (Santa Clara, Calif.; Oct. 27–30, 1992), p. 706; M. Miyashita, T. Tusga, K. Makihara, and T. Ohmi, "Dependence of surface microroughness of CZ, FZ, and EPI wafers on wet chemical processing," *Journal of the Electrochemical Society*, vol. 139 (8) 1992, p. 2133; and T. Ohmi, "ULSI reliability through ultraclean processing," *Proceedings IEEE*, vol. 81 (5), p. 716. Using halogen-based chemistry can damage adjacent circuitry since it is a gross, rather than pinpoint, method of removal.

Removal of surface oxides is also important in preparing metal substrates for the application of adhesives as an alternative to welding in aerospace, automotive and construction (building) applications. Removal of oxide films also has applications in reconditioning weathered metal surfaces and improving the grade of circulated coinage.

Another important treatment process is the creation of nanostructures (extremely small physical structures) on or in substrate materials, such as pressure transducers, accelerometers, atomic force microscope probes, and micromotors. One technique proposed for creation of nanostructures involves chemical etching in combination with masking techniques (useful in bulk micromachining where structural layers of material are built upon a wafer and then a sacrificial layer is etched away). J. Bryzaek, K. Peterson, and W. McCulley, *IEEE Spectrum*, May, 1994, p. 20. Another proposed technique involves the laser-focused deposition of material. J. J. McClelland, R. E. Scholten, E. C. Palm, and R. J. Celotta, "Laser-focused atomic deposition", *Science*, vol. 262, 5 Nov. 1993, p. 877.

Another important treatment process is planarization, to eliminate or reduce non-uniformities in the surface of a substrate. A commonly-used technique for planarization is chemical mechanical polishing (CMP), which uses proprietary slurry mixtures to grind the surface to a planar level through the use of polishing pads. This surface polishing provides the advantage of improved chip performance. CMP planarization is controlled by "etch stops" and by timing the process so that excessive polishing does not occur. This process produces large quantities of contaminants (residual from the slurry) and is very expensive (with an average cost of approximately $35 per wafer), which is attributable to the cost of the consumables such as slurry, water, pads, and brushes for brush cleaners. Another problem associated with CMP is removing the slurry residual from the wafer surface. Removal using brush cleaning, which is the current process, is efficient only to approximately 0.5 $\mu$m particles. An additional drawback of the CMP planarization process is that it is not clusterable with other current cleaning technologies.

Effective removal of undesired material is particularly challenging when the surface of the substrate has a thin film coating of a desired material. Such thin films may have thicknesses of several Angstroms to tens of micrometers. It has been found that the apparatus and techniques described in the parent application are less than completely effective in treating some such substrates—at energy or power fluxes sufficient to effectively remove undesired material, the thin film coating may be damaged. When the flux is decreased to a level which is low enough to avoid damage, the removal of undesired material may be ineffective. Piezoelectric materials, including ferroelectric substances, have also been found to be difficult to treat.

Removal of undesired material from the inner surface of a relatively small closed shape (such as a tube) is more difficult because of the relative inaccessibility of the inner surface to the application of energetic photons from sources such as lasers. One solution to this problem is disclosed in the '039 application, in which photons and inert gas are conducted to the treatment surface by special apparatus. Although this solution offers many benefits, it would be preferable in some circumstances to remove undesired materials from the inner surface without using the relatively more complex apparatus disclosed in the '039 application. In particular, it would be preferable to be able to remove undesired material from the inner surface by application of radiation to the outer surface.

It is desirable in many applications to prepare a surface of a substrate for a processing step by removing contaminants (including undesired chemical species) from bond sites on the surface so that desired materials (other chemical species) may be more effectively chemisorbed.

SUMMARY OF THE INVENTION

The invention solves the problems and avoids the drawbacks of the prior art by selectively removing undesired material from a treatment surface of a substrate by irradiating the undesired material with energetic photons having a spatial and temporal concentration (energy and power fluxes) sufficient to remove the undesired material and insufficient to alter the physical properties of the underlying substrate. Preferably, a gas is flowed continuously across the surface to carry away removed material to avoid redepositing the material elsewhere on the treatment substrate. Optimally, the gas is inert to the substrate and to the material to be removed. Moreover, to best avoid the possibility of contaminants entrained in the flow being deposited on the treatment surface, the flow of gas is preferably in the laminar flow regime.

The radiation source (of energetic photons) may be any means known in the art to provide photons of the requisite energy level, including pulsed or continuous wave lasers and high-energy lamps. In some applications, such as those in which the bonds of interest require the near-simultaneous application of multiple photons, a source with a high power output is preferred, such as a pulsed ultraviolet laser.

The invention is shown to be applicable to the removal of substantially continuous layers of undesired organic and inorganic films. Removal of organic films includes removing paint and marker from stainless steel or quartz substrates. Removal of inorganic oxidation films includes removing oxidation from chromium, molybdenum alloys, nickel/iron alloys, stainless steel, tantalum, tungsten, copper, erbium, and zirconium and removing polycrystalline silicon from quartz. Depending on the properties and thickness of the undesired material and the substrate, and the properties of the available radiation source, it may be necessary to remove the undesired material in a succession of treatment applications.

The topography of a surface may also be modified by appropriate application of the treatment process. For example, relatively more material can be removed from regions in which the thickness of the material is relatively greater, and less in regions where the thickness is less to produce a more uniform material thickness. This can effectively reduce the surface roughness of the material. A source of photons can be coupled in a control loop with an ellipsometer or other surface metrology device to provide feedback to monitor and control the removal of the material in each region. Similarly, applying the radiation to a rough surface at a relatively shallow angle provides a greater incident concentration of photons on the more prominent portions of the surface, while the less prominent portions are shadowed and thus receive a lesser concentration of photons. Relatively more material is therefore removed from the prominent portions, reducing the surface roughness.

Nanostructures can be created by selectively irradiating a surface to remove material from selected areas to a selected depth.

Undesired material may be removed from the surface of a thin film coating upon a substrate material without damaging the surface by treating the surface with polarized laser light.

Undesired materials can also be removed effectively from piezoelectric substances, including ferroelectric materials, by polarized laser light. The removal effectiveness is enhanced by employing flowing gases which have a low reactivity, including noble gases, such as argon.

Directing photons to the side of a substrate opposite to the side bearing the undesired material can increase the removal efficiency of the undesired material and can permit treatment of the interior of closed surfaces from the exterior.

The chemisorption of desired materials onto a substrate surface may be enhanced by removing undesired materials from bond sites to which the desired material may bond by irradiating the surface in the presence of a flowing inert gas, then exposing the surface to the desired material.

DETAILED DESCRIPTION

Figure 1:
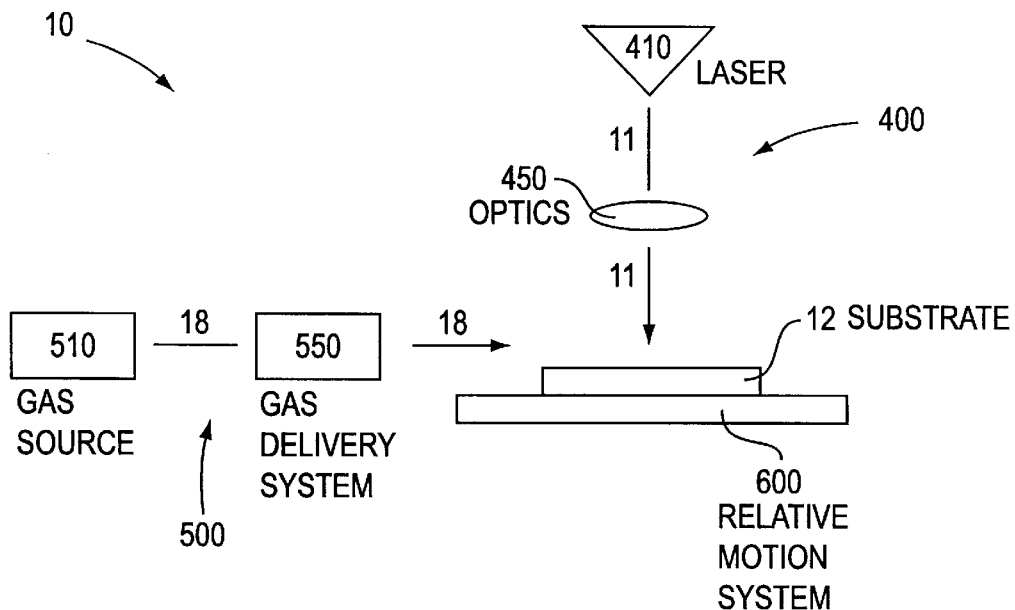
FIG. 1 is a schematic diagram of a method and apparatus for removing undesired material from a substrate according to the principles of the invention.

Reference will now be made in detail to presently preferred embodiments of the invention, examples of which are illustrated in the accompanying drawings. Throughout the drawings, like reference characters are used to designate like elements.

1. Basic Treatment Method and Apparatus

A method and apparatus for removing undesired material from a treatment surface of a substrate without altering the physical properties of the substrate is illustrated schematically in FIG. 1. As shown in FIG. 1, apparatus 10 for treating a substrate 12 from which undesired material is to be removed includes a radiation system 400, a gas system 500, and a relative motion system 600. Irradiation system 400 includes a source 410 of radiation 11 (which consists of energetic photons), such as a laser and suitable delivery optics 450 that conduct radiation 11 to the treatment surface of substrate 12. Gas system 500 includes a source 510 of a gas 18 and an associated delivery system 550 for flowing gas 18 over at least the portion of the surface of substrate 12 to which radiation 11 is applied. Gas 18 is preferably inert to substrate 12 and is flowed across substrate 12 so as to bathe substrate 12 in a non-reactive gas environment. Preferably, gas 18 is a chemically inert gas such as helium, nitrogen, or argon. Relative motion system 600 provides for relative motion between a portion of the treatment surface of substrate 12 to be treated and radiation 11 and, optionally, gas 18.

Each of the constituent elements of these components of apparatus 10 (radiation source 410, delivery optics 450, gas source 510, gas delivery system 550, and relative motion system 600) may be such as are described in the '165 application and are readily selectable by the artisan to configure the apparatus in accordance with the principles of the invention. For example, delivery optics 450 may include mirrors, lenses, optical fibers, collimators, apertures, beam homogenizers, and other elements. Gas delivery system 550 may include conduits, chambers, lines, valves, filters, flow meters, and other elements. Relative motion system 600 may be any suitable system for translational or rotational movement of substrate 12 with respect to radiation 11 and gas 18, and may include a translational stage for planar translation of the substrate, a rotational fixture for rotating the substrate, or movable components in the delivery optics to scan radiation beam 11 across the substrate. Illustrative embodiments of apparatus 10 are described in more detail below.

According to the method of the invention, energetic photons are irradiated upon the substrate treatment surface in a spatial and temporal concentration (energy and power fluxes) sufficient to remove undesired material from the substrate treatment surface and insufficient to alter the physical properties of material that is desired to be left on the substrate surface.

To remove the undesired material, the bonds by which it is adhered to the underlying and adjacent material on the treatment surface (which may be more of the same material, the substrate material, or a third material) must be broken. Each such bond is broken by introducing an amount of energy at least equal to the energy of formation of the bond.

Bond formation energies (i.e., the amount of energy released when the bond is formed) for common substrate materials are shown in Table 1a, below. The bond energies shown are between the material elements themselves (e.g., Cr—Cr) and between the material element and oxygen (e.g., Cr—O). Bond formation energies for various carbon compounds are shown in Table 1b, below.

TABLE 1a

| Element | Bond Formation Energy (eV/bond) | |
| --- | --- | --- |
| | Self | Oxygen (—O) |
| O | | 5.2 |
| Cr | 1.6 | 4.5 |
| Si | 3.4 | 8.3 |
| Mo | 4.2 | 5.8 |
| Fe | 1.0 | 4.1 |
| Ni | 2.1 | 4.0 |
| Er | | 6.4 |
| Zr | | 8.1 |
| Ta | | 8.3 |
| W | | 7.0 |

TABLE 1b

| Element | Bond Formation Energy (eV/bond) |
| --- | --- |
| C | 6.3 |
| Cl | 4.1 |
| F | 5.7 |
| H | 3.5 |
| Mo | 5.0 |
| O | 11.2 |
| Si | 4.7 |
| Zr | 5.8 |

The bonds are broken when energy carried by photons is imparted to the bonds in an amount greater than the bond formation energy. It is believed that there are energy inefficiencies inherent in this bond-breaking process and, therefore, that the amount of photon energy required is approximately twice the bond formation energy. As can be seen in Tables 1a and 1b, oxide bond energies are on the order of 4.0 to 8.3 eV, while organic (carbon) bond energies are on the order of 3.5 to 11.2 eV. Thus, photon energies of approximately 7 to 22 eV are required.

The energy of a photon depends on its wavelength, in the relationship:

$$E = \frac{hc}{\lambda} \qquad \text{Equation 1}$$

where c is the speed of light ($3.00 \times 10^8$ m/s), $\lambda$ is wavelength (m), and h is Planck's constant ($4.14 \times 10^{-15}$ eV sec). Selection of the source of photons therefore depends on the photon energy required, and thus on the wavelength required. A variety of lasers are identified in Table 1c, below. The table identifies the laser medium (and whether the medium is gas (g), liquid (l), solid (s), or plasma (p)), the photon wavelength $\lambda$ (nm), and the photon energy $E_{ph}$ (eV). For continuous wave lasers, an average power $P_{ave}$ (W) is also shown, and for pulsed lasers, the energy per pulse $E_{pulse}$ (J), a representative pulse duration $t_{pulse}$ (ns) and the peak power during a pulse $P_{peak}$ (MW).

TABLE 1c

| Medium | λ (nm) | Eph (eV) | Epulse (J) | tpulse (ns) | Pave (W) | Ppeak (MW) |
| --- | --- | --- | --- | --- | --- | --- |
| C (6+) (p) | 18 | 68.242 | 2.00E − 03 | 50 | | 4.00E − 02 |
| ArF excimer (g) | 193 | 6.435 | 5.00E − 01 | 50 | | 1.00E + 01 |
| KrF excimer (g) | 248 | 5.008 | 5.00E − 01 | 34 | | 1.47E + 01 |
| He—Cd (g) | 442 | 2.810 | | | 1.00E − 02 | |
| Ar+ (g) | 515 | 2.412 | | | 1.00E + 01 | |
| Rhodamine-6G dye (l) | 560 | 2.218 | | | 1.00E − 01 | |
| | 640 | 1.941 | | | 1.00E − 01 | |
| He—Ne (g) | 633 | 1.962 | | | 1.00E − 03 | |
| Kr+ (g) | 647 | 1.920 | | | 5.00E − 01 | |
| Ruby (s) | 693 | 1.792 | 5.00E + 00 | 50 | | 1.00E + 02 |
| Ti(3+):Al2O3 (s) | 660 | 1.882 | | | 1.00E + 01 | |
| | 1180 | 1.053 | | | | |
| Nd(3+):glass (s) | 1060 | 1.172 | 5.00E + 01 | 50 | | 1.00E + 03 |
| Nd(3+):YAG (s) | 1064 | 1.167 | | | 1.00E + 01 | |
| KF Color Center (s) | 1250 | 0.994 | | | 5.00E − 01 | |
| | 1450 | 0.857 | | | 5.00E − 01 | |
| He—Ne (g) | 3390 | 0.366 | | | 1.00E − 03 | |
| FEL (LANL) | 9000 | 0.138 | 1.00E − 03 | 50 | | 2.00E − 02 |
| | 40000 | 0.031 | 1.00E − 03 | 50 | | 2.00E − 02 |
| CO2 (g) | 10600 | 0.117 | | | 1.00E + 02 | |
| H2O (g) | 118700 | 0.010 | | | 1.00E − 05 | |
| HCN (g) | 336800 | 0.004 | | | 1.00E − 03 | |

Comparing the photon energies for the above lasers to the required energies identified above for common substrate materials (and accounting for the expected inefficiencies), it is apparent that in most cases the energy of a single photon will not be sufficient to break the bonds of interest. However, it is believed that the bond-breaking energy can be supplied by multiple photons if the photons strike the bond within a very short time, or essentially "simultaneously."

Since a certain amount of energy is required to break each bond, the total amount of energy (and thus, the total number of photons of a given energy) required to remove a given amount of undesired material from the treatment surface of a substrate is generally proportional to the number of bonds in that amount of material. It is believed that photons interact with bonds only in the interfacial region of the treatment surface (i.e., the topmost one or two layers of atoms or molecules (monolayers)). For removal of substantially continuous layers of material (such as oxide layers) it is therefore helpful to consider unit surface areas and thicknesses of material in monolayers. Thus, for a given surface area, the removal of a certain thickness (or number of monolayers) of material requires the effective application of a given amount of energy (number of photons). Of course, not all of the photons that strike a substrate treatment surface will contribute to bond breaking—it is believed that a small fraction of the photons contribute to bond breaking. This is believed to be at least in part because the effective locations (the bonds, or parts thereof) for absorption of the photon energy occupy a small fraction of the surface area. However, at least for a given material, it is believed that there is a relatively constant relationship between the actual number of photons required and the theoretical number based on the number of bonds to be broken. Accordingly, a relevant parameter to consider is the energy flux (energy per unit area, or number of photons per unit area) applied to a substrate treatment surface, which corresponds to a thickness of undesired material removed.

As noted above, there are cases in which the bonds of interest require more energy than is carried by a single photon emitted by the selected radiation source. Such bonds are referred to herein as a "multi-photon bonds." As noted above, the energies of two or more photons are believed to be additive to supply the energy required to break a multi-photon bond only if the photons strike the bond simultaneously. This implicates the arrival rate of photons at a bond site, which is a power flux (energy per unit time per unit area). Further, it is believed that there is a probabilistic nature to multi-photon bond breaking. For a given average power flux over an area of the substrate, there is an average arrival rate of photons at any given bond site. However, the actual arrival rate of photons should be randomly distributed about the average value. Thus, if there is a minimum photon arrival rate (maximum time interval between the photons) at which photon energy addition will take place to allow breaking of a multi-photon bond, an average power flux applied to a given area that corresponds to that minimum arrival rate will expose approximately half of the bond sites in that area exposed to the requisite arrival rate (or a greater rate). Conversely, even if the average power flux is somewhat lower than that required to produce the minimum required photon arrival rate, it is expected that photons will arrive at some of the bond sites within the required interval.

In summary, to remove a given thickness of undesired material from a substrate treatment surface, a minimum total energy flux (a total number of photons of a given energy level per unit area) must be applied to the undesired material. If multi-photon bonds are involved, a certain power flux is also required, and the higher the power flux, the greater the chance that each bond site will be subjected to the requisite photon arrival rate. The selection of a suitable source of energetic photons thus requires an evaluation of the required photon energy and, for multi-photon bonds, the available power. As will become apparent from the data presented below, to remove oxides and organic films (which have high, and therefore multi-photon, bond energies), preferred photon sources are therefore pulsed UV lasers, which have the highest peak power levels and high photon energies.

A competing consideration limits the energy and power fluxes that may be applied to a substrate treatment surface—the need to avoid altering the physical properties of the material that is to be left on the surface. In general, changes in the physical properties of a material are caused by increasing the temperature of the material above a threshold level. The change in temperature of the surface of a material caused by the application of radiant energy depends on the heat transfer characteristics of the material and the power and energy fluxes of the applied radiation. Finding the maximum power and energy fluxes usable on a given substrate material will require some experimentation. Prior art laser cleaning techniques that rely on vaporization, ablation, or surface melting provide some guidance in the energy and power fluxes required to produce state changes in substrate materials.

In general, the photons are preferably directed perpendicular to the plane of the portion of the substrate being treated, to maximize the power and energy fluxes at the surface for a given output from the source of photons. However, the photons may be directed at an angle to the substrate as convenient or necessary for implementation of the process in a particular environment. Of course, the energy and power fluxes at the surface will vary with the sine of the angle of incidence of the photons with respect to the plane of the surface, which must be taken into account in selecting the output of the photon source. In some situations, it may be preferable to direct the radiation at an oblique angle to the substrate to preferentially irradiate, and thus remove, peaks in the material to smooth it.

A beam of light emanating from a laser typically has a gaussian beam shape. The gaussian shape represents the nature of the delivered energy as the energy is the greatest at the center and decreases toward the edges of the beam. This gaussian beam shape is effective when used in combination with spherical optics and has applicability in the areas of lithography, drilling, and micromachining.

On the other hand, uniform energy density across the beam profile ("a flat top beam profile") is advantageous for a number of applications. A flat top beam profile can be generated through the use of apertures and/or a beam homogenizer. This profile allows a significant amount of flexibility in shaping the beam focus to prevent damage to the substrate and allows removal of undesired material with a lower amount of energy since sufficient energy can be uniformly delivered to all parts of the scanned area without overexposing the center of the scanned area. Additionally, a flat top profile allows for the utilization of a cylindrical lens for the final focus at the work piece which also provides for a more uniform distribution of energy.

2. Test Apparatus

Two sets of test apparatus (referred to herein as apparatus A and B) were used in the following examples. Apparatus A is illustrated schematically in FIG. 2A. In this apparatus (identified in the figure as 10A), the radiation source is laser 411, which is a pulsed KrF excimer laser, sold by Lambda Physik as model number LEXtra 200. This laser has a wavelength of 248 nm (for a photon energy of 5.01 eV), a maximum output energy per pulse of 600 mJ, and a fixed pulse duration of 34 ns (for a maximum power per pulse of 17.65 MW). The maximum pulse repetition rate is 30 Hz, producing a maximum average power of 18 W. The radiation beam is 23 mm by 13 mm at the laser output.

Radiation delivery system 450 includes, in the order encountered by radiation beam 11 upon leaving laser 411, an aperture plate 452, 45° turning mirrors 453, 454, 455, and 456, and adjustable focusing lens 457. Aperture plate 452 is a flat plate with a rectangular aperture 6 mm wide and 25 mm long, and is used to block the "tails" of the Gaussian distribution of photons emanating from laser 411, so that the spatial distribution of energy in radiation beam 11 is approximately uniform across a plane perpendicular to the beam. Turning mirrors 453 (50 mm), 454 (50 mm), 455 (25 mm), and 456 (25 mm) are planar mirrors. Adjustable focusing lens 457 is a cylindrical lens with a width of 25 mm, a length of 37 mm, and a focal length of 75 mm. By selecting the height of focusing lens 457 from the surface of substrate 12 and the orientation (concave side up or down) of the lens, the width of the beam spot at the substrate surface is adjusted. All optical elements are anti-reflection coated for 248 nm light.

Figure 2A:
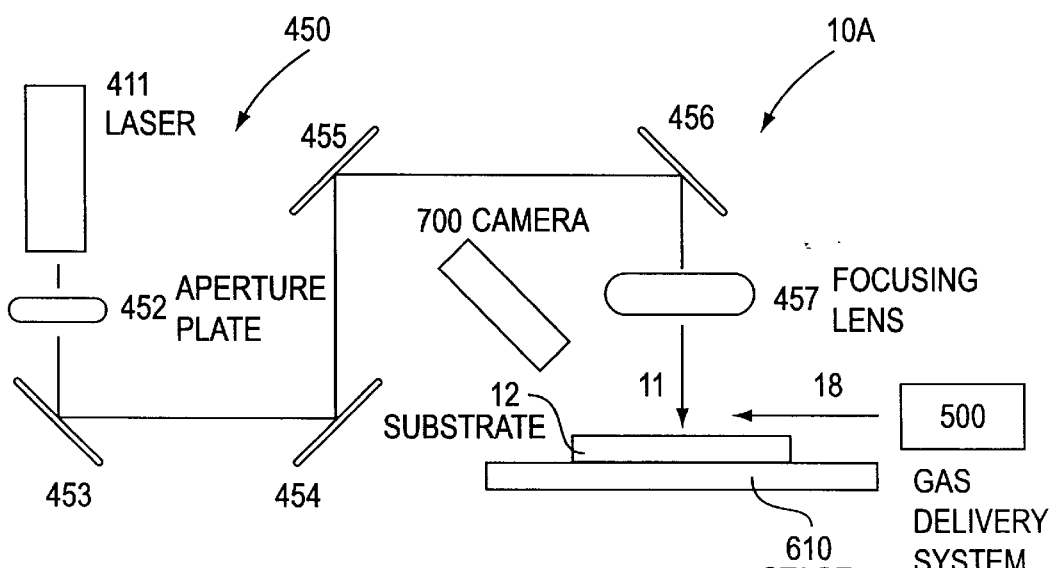
FIGS. 2A–B are schematic diagrams of two test apparatuses used to remove materials from selected substrates.
Figure 2B:
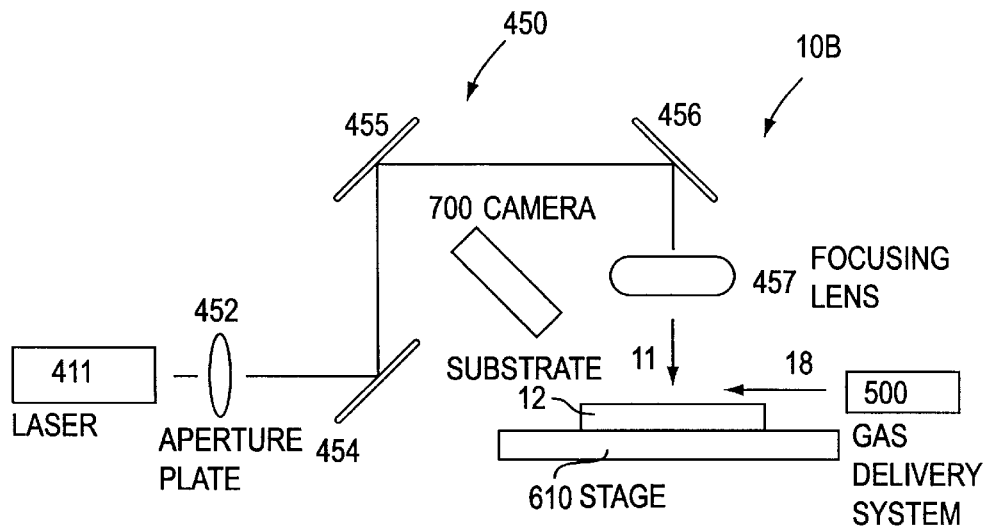
Figure 2C:
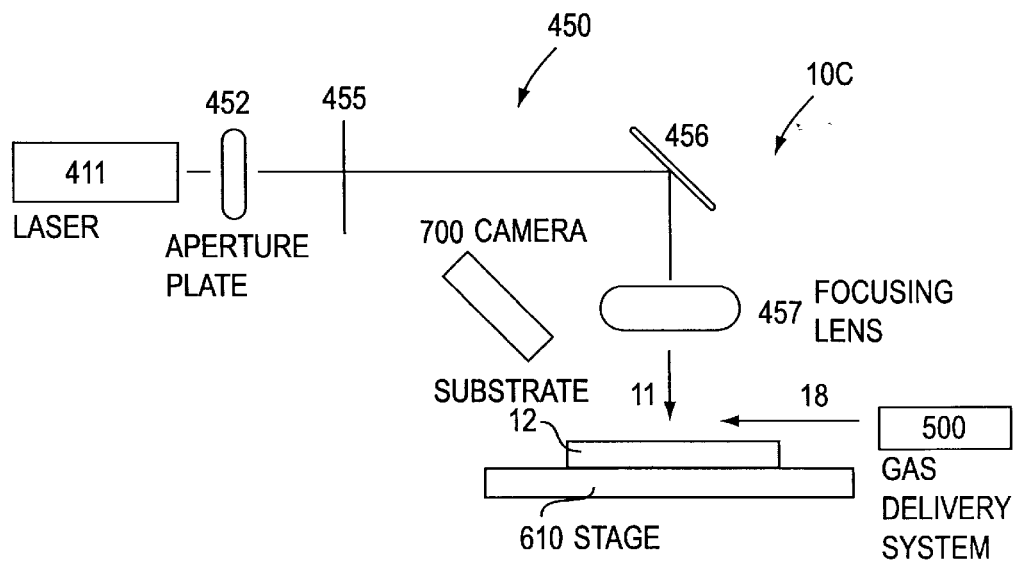
FIG. 2C is a schematic diagram of a third apparatus, similar to those in FIGS. 2A–B but with a simpler optical train.

The delivery system 450 of the second apparatus, Apparatus B (shown in FIG. 2B), is identical to that of Apparatus A except that first turning mirror 453 is omitted (and laser 411 and aperture plate 452 are correspondingly reoriented 90° to point directly toward turning mirror 454) and turning mirror 455 is 50 mm (rather than 25 mm as in Apparatus A). A third apparatus (not used in the experiments) with a simpler (and therefore preferred) optical train is shown in FIG. 2C.

Figure 3:
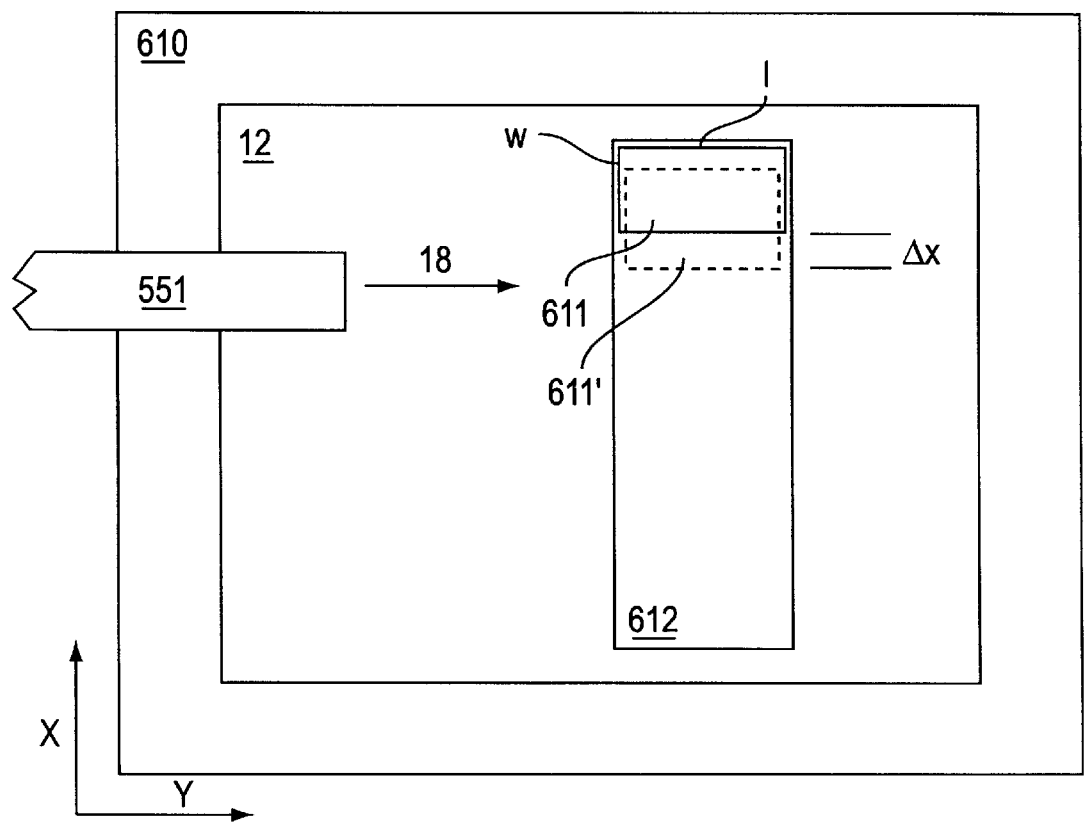
FIG. 3 is a schematic diagram of the geometry of the incident radiation region produced on a substrate by any of the apparatuses of FIGS. 2A–C.

Radiation beam 11 is delivered approximately perpendicular to stage 610 on which substrate 12 is mounted. As shown in FIG. 3, stage 610 can be translated in the X and Y directions (parallel to the plane of the stage, and indicated in FIG. 3 by arrows X and Y). Radiation beam 11 produces a generally rectangular incident radiation region 611 with a width w and a length l. Region 611 is swept across the surface of substrate 12 by translating stage 610.

Gas delivery system 500 includes a dewar of liquid nitrogen (4500 l capacity) coupled in series to: a dual stage regulator; a moisture/oxygen adsorber (MG Industries Oxisorb, which adsorbs to concentrations of 0.01 ppb); a Millipore Model 304 particle filter (filters to 0.003 µm); a flow meter; a U.S. Filter Membralox filter (filters to 0.001 µm); and thence to a nozzle 551 terminating adjacent region 611. Nozzle 551 discharges a flow of gas 18 across region 611, and remains fixed with respect to region 611 so that stage 610 and substrate 12 translate with respect to it. This gas delivery system is useful for materials that are not sensitive to typical atmospheric gases, and permits a simpler apparatus than is required when it is required or desired to isolate the substrate from the atmosphere during treatment (such as disclosed in the '165 application).

A video camera 700 is positioned to view region 611 and thus provide visual data on the results of treatment.

In the illustrated embodiment, stage 610 is first translated longitudinally in the X direction as radiation beam 11 is applied to the surface of substrate 12, producing an elongated rectangular swath 612 on substrate 12 that has been exposed to radiation beam 12. Stage 610 may be indexed back to a starting position and translated in the X direction again so that radiation beam 12 makes another "pass" over swath 612. After one or more passes, stage 610 may be translated laterally in the Y direction a distance approximately equal to length l, then translated again through the X direction to form another swath adjacent to the previous swath 612. Thus, the portion of the surface of substrate 12 to be treated is sequentially exposed to radiation beam 11 and the concurrent flow of gas 18.

The energy flux (energy per unit area) applied to any point on the surface of substrate 12 by radiation beam 11 during a single pulse of laser 411 is equal to the energy of the pulse at the surface divided by the area over which that energy is distributed. This can be expressed as:

$$F_{eps} = \frac{E_{ps}}{l \cdot w} \qquad \text{Equation 2}$$

where $F_{eps}$ is the pulse energy flux per unit area at the surface (J/cm$^2$), $E_{ps}$ is the pulse energy at the surface (J), and l and w are the length and width of region 611 (mm). Similarly, a pulse power flux ($F_{pps}$) can be calculated as:

$$F_{pps} = \frac{F_{eps}}{t_p} \qquad \text{Equation 3}$$

where $t_p$ is the laser pulse duration.

There are energy losses associated with the passage of radiation beam 11 through the optics and aperture plate. Thus, the laser pulse energy at the surface ($E_{ps}$) is less than the emitted laser pulse energy. The LEXtra 200 laser includes a mini-controller with a pulse energy meter that is useful for recording the laser energy output during experiments. However, the internal meter is not extremely accurate. To provide more accurate energy measurements, the test apparatus was calibrated to develop a correction factor to be applied to the internal meter reading to produce a more accurate reading. Accordingly, the laser pulse energy at the surface ($E_{ps}$) was measured with a Molectron J50 detector head and JD 1000 joulemeter disposed at the location of the treatment surface, and the measured energy reading compared to the internal meter reading of pulse energy ($E_{pm}$). A correction factor ($R_{correction}$) was thus developed that included both the losses through the optical train and the meter inaccuracies.

$$E_{ps} = E_{pm} \cdot R_{correction} \qquad \text{Equation 4}$$

This correction factor is not constant—it has been found to vary approximately linearly with the output level of the laser. The pulse energy is dependent on the voltage input ($V_l$) to the laser, which can be adjusted to levels between approximately 17 and 22 kV. The laser output energy (as indicated by the internal meter) varies for a given voltage setting, depending on such factors as the laser gas supply level, so that the voltage cannot be used directly as a measure of pulse energy, but instead the internal meter is read. For convenience, the correction factor is calculated as a function of the voltage setting, then applied to the energy read from the internal meter. The correction factor is of the form:

$$R_{correction} = \frac{1}{m \cdot V_l + b} \qquad \text{Equation 5}$$

where m is the slope, and b is the intercept, of the linear relationship.

The values of the m and b for the two test apparatuses are shown in Table 2a, below.

TABLE 2a

| Factor | App. A | App. B |
|--------|--------|--------|
| b | 1.20 | 0.74 |
| m | 0.029 | 0.066 |

Thus, the energy per pulse at the treatment surface is:

$$E_{ps} = \frac{E_{pm}}{m \cdot V_l + b} \quad \text{Equation 6}$$

In the illustrated embodiment, a swath 612 is formed from a series of discrete regions 611 (as indicated in FIG. 3 by a second region 611' shown in phantom). The distance by which region 611' is offset from region 611 (ΔX) is the product of the time between laser pulses (which is the inverse of the laser pulse repetition rate $R_l$) and the velocity of translation of stage 610 (the scan velocity $v_s$). The energy flux delivered to a given point on the substrate is thus the product of the energy flux per pulse ($F_{eps}$) and the number of laser pulses to which the point is exposed ($N_{pl}$). The number of pulses $N_{pl}$ is equal to the width w of region 611 divided by the distance ΔX that the stage moves between pulses. Of course, if w is not an integral multiple of ΔX, and each point must receive an integer number of pulses, not every point will receive the same number of pulses. However, the relationship outlined above is reasonably accurate to determine the average energy applied over each swath 612. Further, rather than indexing the stage laterally before beginning another swath 612, the stage can be left in the same lateral position, and another swath 612 applied in the same place, thus making another "pass" over the substrate. The total energy flux delivered ($F_{et}$) is thus equal to the energy flux per pass ($F_{epa}$) times the number of passes ($N_{pa}$).

The average energy flux applied to the surface of substrate 12 can thus be calculated as:

$$F_{epa} = \frac{F_{eps} \cdot R_l \cdot w}{v_s} \quad \text{Equation 7}$$

The total energy flux applied to a given point is obtained by multiplying the energy flux per pass ($F_{epa}$) by the number of passes:

$$F_{et} = F_{epa} \cdot n_{pa} \quad \text{Equation 8}$$

In the experimental data presented below, the test parameters are identified as shown in Table 2b, below.

TABLE 2b

| Parameter | Description | Units |
|---|---|---|
| $E_{pm}$ | Pulse energy (meter) | mJ |
| $E_{ps}$ | Pulse energy (actual at surface) | mJ |
| $F_{eps}$ | Energy flux per pulse (at surface) | J/cm² |
| $F_{pps}$ | Power flux per pulse (at surface) | MW/cm² |
| $F_{epa}$ | Average energy flux per pass | J/cm² |
| $F_{et}$ | Total energy flux (over total number of passes) | J/cm² |
| l | Length of region 611 | mm |
| $N_{pl}$ | Effective number of pulses striking a point | — |

TABLE 2b-continued

| Parameter | Description | Units |
|---|---|---|
| $N_{pa}$ | Number of passes | — |
| $R_g$ | Gas supply rate | ml/s |
| $R_l$ | Laser repetiton rate | s⁻¹ |
| $v_s$ | Laser scan velocity | mm/s |
| $V_l$ | Laser voltage | kV |
| w | Width of region 611 | mm |

Unless otherwise specified, the gas used was nitrogen and the flow rate across the treatment surface was between 250 and 500 ml/s.

3. Examples of Removal of Oxidation Films

The application of the basic treatment method and apparatus described above with regard to oxidation films is illustrated in the following examples. In each example, a series of treatment "runs" was made on one or more samples of oxidized substrate materials. Each run consisted of treating a single swath 612 across the treatment surface, with one or more passes on the swath. Unless otherwise noted, the samples were treated on a planar surface (such as on the flat face of the sputter targets).

The effectiveness of the treatment is classified according to a six point cleaning rate ($R_c$) scale, which is explained in Table 3a, below TABLE 3a

| Rc | Meaning |
|---|---|
| 1 | Removed completely |
| 2 | Additional pass required |
| 3 | Multiple passes required |
| 4 | Poor removal requires change in process conditions |
| 5 | Marginal set of conditions |
| 6 | No removal |

In these tests, the objective was to remove all of the oxide in as few passes as possible (preferably in a single pass) and at the highest stage velocity possible, without damaging the treatment surface. This corresponds to a maximum processing rate for commercial application—treating a substrate in the least possible time. As discussed above, it is believed that the key process factors are the energy flux per pulse ($F_{eps}$), the directly related (by the fixed pulse duration of 34 ns) power flux per pulse ($F_{pps}$), and the total energy flux ($F_{et}$). These process factors were varied by adjusting the pulse energy ($E_{ps}$), laser pulse repetition rate ($R_l$), stage velocity ($V_s$), and incident region width (w).

a. Chromium Sputter Target

In this example, an oxidized chromium sputter target was treated with Apparatus B. The sputter target (as with the other sputter targets used in the experiments described below) was approximately 21 cm long, and slightly oval in shape with a maximum width of 9 cm. A series of nine runs was conducted, the results of which are summarized in Table 3b, below.

TABLE 3b

| Run | Vl | Epm | Eps | Rl | vs | l | w | Feps | Fpps | Npl | Fepa | Npa | Fet | Comments | Rc |
|---|---|---|---|---|---|---|---|---|---|---|---|---|---|---|---|
| 2 | 18 | 275 | 143 | 20 | 5 | 23 | 2.90 | 0.21 | 6.3 | 11.6 | 2.48 | 1 | 2.48 | No removal observed | 6 |
| 3 | 18 | 273 | 142 | 30 | 5 | 23 | 2.90 | 0.21 | 6.2 | 17.4 | 3.69 | 1 | 3.69 | Same as R2, change parameters | 6 |
| 4 | 18 | 279 | 145 | 30 | 5 | 23 | 2.05 | 0.31 | 9.0 | 12.3 | 3.78 | 1 | 3.78 | No removal observed | 6 |
| 5 | 19 | 348 | 175 | 30 | 5 | 23 | 2.05 | 0.37 | 10.9 | 12.3 | 4.55 | 1 | 4.55 | No removal observed | 6 |

TABLE 3b-continued

| Run | Vl | Epm | Eps | Rl | vs | l | w | Feps | Fpps | Npl | Fepa | Npa | Fet | Comments | Rc |
|---|---|---|---|---|---|---|---|---|---|---|---|---|---|---|---|
| 6 | 20 | 390 | 189 | 30 | 5 | 23 | 2.05 | 0.40 | 11.8 | 12.3 | 4.94 | 1 | 4.94 | Marginal/narrow width | 5 |
| 7 | 20 | 390 | 189 | 30 | 5 | 23 | 0.90 | 0.91 | 26.9 | 5.4 | 4.94 | 1 | 4.94 | Removed | 1 |
| 8 | 19 | 348 | 175 | 30 | 5 | 23 | 0.90 | 0.84 | 24.8 | 5.4 | 4.55 | 1 | 4.55 | Removed | 1 |
| 9 | 19 | 351 | 176 | 30 | 10 | 23 | 0.90 | 0.85 | 25.0 | 2.7 | 2.30 | 1 | 2.30 | Removed, but higher E required | 5 |
| 10 | 20 | 396 | 192 | 30 | 7 | 23 | 0.90 | 0.93 | 27.3 | 3.9 | 3.58 | 1 | 3.58 | Removed/fingerprints | 1 |

These data suggest that the power flux per pulse levels applied in the runs spanned a threshold level for multi-photon bonds. Good removal was obtained for values of $F_{pps}$ greater than approximately 12 MW/cm$^2$, even for constant values of $F_{epa}$ (e.g., from runs 5 to 7) and then for lower values of $F_{epa}$ (e.g., from runs 8 to 10).

b. Erbium Sputter Target

In this example, an oxidized erbium sputter target was treated with apparatus B. The results are summarized in Table 3c, below.

TABLE 3c

| Run | Vl | Epm | Eps | Rl | vs | l | w | Feps | Fpps | Npl | Fepa | Npa | Fet | Comments | Rc |
|---|---|---|---|---|---|---|---|---|---|---|---|---|---|---|---|
| 1 | 18 | 303 | 157 | 20 | 5 | 23 | 2.90 | 0.24 | 6.9 | 11.6 | 2.73 | 1 | 2.73 | Bluish oxide remained after 1 pass | 1 |
| 1a | 18 | 303 | 157 | 20 | 5 | 23 | 2.90 | 0.24 | 6.9 | 11.6 | 2.73 | 1 | 2.73 | 2 passes made, 1 sufficient | 1 |
| 2 | 19 | 354 | 178 | 20 | 10 | 23 | 2.90 | 0.27 | 7.8 | 5.8 | 1.54 | 1 | 1.54 | 1 pass removed oxide | 1 |
| 3 | 20 | 390 | 192 | 20 | 15 | 23 | 2.90 | 0.29 | 8.5 | 3.9 | 1.12 | 1 | 1.12 | 1 pass removed oxide | 1 |
| 5 | 20 | 414 | 201 | 20 | 20 | 23 | 2.90 | 0.30 | 8.9 | 2.9 | 0.87 | 1 | 0.87 | 1 pass removed oxide | 1 |
| 6 | 20 | 414 | 201 | 20 | 25 | 23 | 2.90 | 0.30 | 8.9 | 2.3 | 0.70 | 1 | 0.70 | 1 pass removed oxide | 1 |
| 7 | 20 | 423 | 205 | 30 | 50 | 23 | 2.90 | 0.31 | 9.1 | 1.7 | 0.54 | 1 | 0.54 | Diffraction pattern formed | 5 |

The blue oxide observed is believed to be erbium oxide or some other byproduct of sputtering target interaction. All runs were made with the same beam width of 2.9 mm, while laser pulse energy $E_{ps}$ (and thus, pulse power flux $F_{pps}$) was slightly increased, and the scan rate significantly increased, from run to run. The first two runs produced partial cleaning, while successive runs (at slightly higher $F_{pps}$ values of approximately 8 MW/cm$^2$) produced good cleaning, with successively lower levels of total energy flux $F_{et}$, with 0.7 J/cm$^2$ still providing good removal. This again suggests that a multi-photon bond threshold for $F_{pps}$ is crossed between runs 2 and 3.

In run 7, the stage velocity $V_s$ was increased to 50 mm/s in an attempt to reduce the total energy flux to a level too low to remove the oxide. This run produced a "diffraction" pattern of residual oxide lines in the X-direction, suggesting that the regions where the oxide remained had not been exposed to the same energy or power fluxes as the intermediate, cleaned regions. Although the velocity was not so high that successive incident regions (611) were non-overlapping (at the laser repetition rate of 30/s, the substrate moved a distance (1.6 mm) between pulses, which is less than the width of the incident region (2.9 mm)), the observed effect may be indicative of a Gaussian distribution of photons across the X dimension of the incident region 611.

c. Zirconium Sputter Target

In this example, an oxidized zirconium sputter target was treated with Apparatus B. The results are summarized in Table 3d, below.

TABLE 3d

| Run | Vl | Epm | Eps | Rl | vs | l | w | Feps | Fpps | Npl | Fepa | Npa | Fet | Comments | Rc |
|---|---|---|---|---|---|---|---|---|---|---|---|---|---|---|---|
| 1 | 18 | 279 | 145 | 20 | 3 | 23 | 2.90 | 0.22 | 6.4 | 19.3 | 4.19 | 1 | 4.19 | 1 pass removed | 1 |
| 2 | 18 | 279 | 145 | 20 | 5 | 23 | 2.90 | 0.22 | 6.4 | 11.6 | 2.52 | 1 | 2.52 | 1 pass removed | 1 |
| 3 | 18 | 279 | 145 | 20 | 5 | 23 | 2.90 | 0.22 | 6.4 | 11.6 | 2.52 | 2 | 5.03 | 2 passes made, 1 pass sufficient | 1 |
| 4 | 19 | 366 | 184 | 20 | 5 | 23 | 2.90 | 0.28 | 8.1 | 11.6 | 3.19 | 1 | 3.19 | 1 pass/cleaned | 1 |
| 5 | 19 | 366 | 184 | 20 | 8 | 23 | 2.90 | 0.28 | 8.1 | 7.3 | 2.00 | 1 | 2.00 | 1 pass removed | 1 |
| 6 | 19 | 366 | 184 | 20 | 10 | 23 | 2.90 | 0.28 | 8.1 | 5.8 | 1.60 | 1 | 1.60 | 1 pass removed | 1 |
| 7 | 20 | 417 | 202 | 20 | 15 | 23 | 2.90 | 0.30 | 8.9 | 3.9 | 1.17 | 1 | 1.17 | 1 pass removed | 1 |
| 8 | 20 | 417 | 202 | 20 | 20 | 23 | 2.90 | 0.30 | 8.9 | 2.9 | 0.88 | 1 | 0.88 | 1 pass removed | 1 |

As with the previous example, all runs were made with the same beam width of 2.9 mm, while pulse energy $E_{ps}$ (and thus pulse power flux $F_{pps}$) was slightly increased, and the scan rate significantly increased, from run to run. Each run produced good cleaning, with successively lower levels of total energy flux, with approximately 0.9 J/cm$^2$ still providing good removal.

d. Tantalum Holder

In this example, an oxidized tantalum cylindrical holder was treated with Apparatus B. Since the holder was cylindrical, it presented a curved surface for treatment, and the linear translation capability of the stage was not adequate to scan the beam incidence region 611 smoothly over the surface. Accordingly, the holder was manually rotated at a rate at which incidence regions were non-overlapping. The data shown in Table 3e below therefore applies to the isolated incident regions.

TABLE 3e

| Run | Vl | Epm | Eps | Rl | vs | l | w | Feps | Fpps | Npl | Fepa | Npa | Fet | Comments | Rc |
|---|---|---|---|---|---|---|---|---|---|---|---|---|---|---|---|
| 1 | 19 | 315 | 158 | 30 | m | 23 | 0.57 | 1.20 | 35.4 | 1 | 1.20 | 1 | 1.20 | Removed oxide, some dwell dama | 5 |
| 2 | 19 | 291 | 148 | 30 | m | 23 | 0.57 | 1.13 | 33.3 | 1 | 1.13 | 1 | 1.13 | Removed oxide, some dwell dama | 5 |
| 3 | 18 | 264 | 137 | 30 | m | 23 | 0.57 | 1.04 | 30.7 | 1 | 1.04 | 1 | 1.04 | Removed oxide, some dwell dama | 5 |
| 4 | 18 | 267 | 138 | 30 | m | 23 | 1.2 | 0.50 | 14.8 | 1 | 0.50 | 1 | 0.50 | Removed oxide, no damage | 1 |
| 5 | 19 | 327 | 164 | 30 | m | 23 | 1.2 | 0.59 | 17.5 | 1 | 0.59 | 1 | 0.59 | Removed oxide, no damage | 1 |
| 6 | 20 | 351 | 173 | 30 | m | 23 | 1.2 | 0.63 | 18.5 | 1 | 0.63 | 1 | 0.63 | Removed oxide, no damage | 1 |
| 7 | 20 | 414 | 201 | 30 | m | 23 | 1.2 | 0.73 | 21.4 | 1 | 0.73 | 1 | 0.73 | Removed oxide, no damage | 1 |

The data show that an energy flux of approximately 0.5 J/cm$^2$ is adequate to remove the tantalum oxide film from the underlying tantalum substrate. At a power flux of more than approximately 22 MW/cm$^2$ (in Runs 1–3), some dwell damage was produced in that blackening of the substrate surface was observed.

e. Tungsten Crucible

In this example, an oxidized tungsten crucible was treated with apparatus B. The crucible was approximately 10 cm long and 2.5 cm wide, had an elongated dish shape (approximately semi-cylindrical in the region treated). The data shown in Table 3f below include runs 1–3 on the inside surface (concave) and 4–7 on the outside (convex).

TABLE 3f

| Run | Vl | Epm | Eps | Rl | vs | l | w | Feps | Fpps | Npl | Fepa | Npa | Fet | Comments | Rc |
|---|---|---|---|---|---|---|---|---|---|---|---|---|---|---|---|
| 1 | 19 | 330 | 165 | 30 | 5 | 23 | 0.63 | 1.14 | 33.6 | 3.8 | 4.32 | 1 | 4.32 | 1 pass removed | 1 |
| 2 | 19 | 330 | 165 | 30 | 5 | 23 | 0.63 | 1.14 | 33.6 | 3.8 | 4.32 | 2 | 8.63 | 1 pass removed, 2nd pass made by | 1 |
| 3 | 19 | 330 | 165 | 30 | 8 | 23 | 0.63 | 1.14 | 33.6 | 2.4 | 2.70 | 1 | 2.70 | 1 pass removed | 1 |
| 4 | 21 | 414 | 195 | 30 | 8 | 23 | 0.63 | 1.34 | 39.5 | 2.4 | 3.17 | 1 | 3.17 | 1 pass removed | 1 |
| 5 | 21 | 405 | 190 | 30 | 12 | 23 | 0.63 | 1.31 | 38.7 | 1.6 | 2.07 | 1 | 2.07 | 1 pass removed | 1 |
| 6 | 22 | 438 | 200 | 30 | 15 | 23 | 0.63 | 1.38 | 40.6 | 1.3 | 1.74 | 1 | 1.74 | 1 pass removed | 1 |
| 7 | 22 | 429 | 196 | 30 | 20 | 23 | 0.63 | 1.35 | 39.7 | 0.9 | 1.28 | 1 | 1.28 | 1 pass removed | 1 |

These data show that tungsten oxide can be removed at an energy flux as low as approximately 1.3 J/cm$^2$, while the substrate is not damaged at power flux rates as high as approximately 41 MW/cm$^2$.

f. Molybdenum Alloy Masks

In this example, three oxidized masks (used in the production of wire pattern packaging areas of silicon chips) made of molybdenum alloy were treated with Apparatus A. The data from the treatment of the masks are summarized in Table 3g, below.

TABLE 3g

| Run | Vl | Epm | Eps | Rl | vs | l | w | Feps | Fpps | Npl | Fepa | Npa | Fet | Comments | Rc |
|---|---|---|---|---|---|---|---|---|---|---|---|---|---|---|---|
| Sample 1 = 125 mm mask | | | | | | | | | | | | | | | |
| 4 | 22 | 528 | 285 | 30 | 5 | 23 | 1.3 | 0.95 | 28.1 | 7.8 | 7.45 | 2 | 14.89 | 2 passes required | 2 |
| 5 | 22 | 528 | 285 | 30 | 2 | 23 | 1.3 | 0.95 | 28.1 | 19.5 | 18.62 | 2 | 37.23 | 2 passes required | 2 |

TABLE 3g-continued

| Run | Vl | Epm | Eps | Rl | vs | l | w | Feps | Fpps | Npl | Fepa | Npa | Fet | Comments | Rc |
|---|---|---|---|---|---|---|---|---|---|---|---|---|---|---|---|
| 6 | 20 | 450 | 251 | 30 | 2 | 23 | 1.3 | 0.84 | 24.7 | 19.5 | 16.39 | 2 | 32.77 | 2 passes required, brownish residue | 4 |
| 7 | 18 | 324 | 187 | 30 | 2 | 23 | 1.3 | 0.63 | 18.4 | 19.5 | 12.20 | 2 | 24.40 | 2 passes required | 4 |
| 8 | 20 | 528 | 295 | 30 | 5 | 23 | 1.3 | 0.99 | 29.0 | 7.8 | 7.69 | 2 | 15.38 | 2 passes required, no residue | 2 |
| 9a | 20 | 528 | 295 | 30 | 2 | 23 | 1.3 | 0.99 | 29.0 | 19.5 | 19.23 | 1 | 19.23 | 1 pass, brownish residue | 4 |
| 9b | 20 | 528 | 295 | 30 | 5 | 23 | 1.3 | 0.99 | 29.0 | 7.8 | 7.69 | 2 | 15.38 | 2 passes required | 2 |
| Sample 2 = 82 mm mask | | | | | | | | | | | | | | | |
| 1 | 22 | 525 | 284 | 30 | 2 | 23 | 0.6 | 2.06 | 60.5 | 9.0 | 18.51 | 1 | 18.51 | 1 pass removed | 1 |
| Sample 3 = 82 mm mask | | | | | | | | | | | | | | | |
| 1 | 22 | 525 | 284 | 30 | 5 | 23 | 0.6 | 2.06 | 60.5 | 3.6 | 7.40 | 1 | 7.40 | 1 pass removed | 1 |

Higher total energy fluxes ($F_{et}$) were required to remove the oxidation from the larger mask used as sample 1 than for the other two masks. On the first mask, the treatment left a brownish residue on runs 6 and 9a, which may be indicative of damage to the remaining material. The data also suggest that $F_{pps}$ did not exceed a multi-photon bond power threshold in Sample 1 (where $F_{pps}$ was less than approximately 30 MW/cm$^2$) but did exceed the threshold in Samples 2 and 3 ($F_{pps}$ over approximately 60 MW/cm$^2$).

g. Steel Ruler

In this example, an oxidized steel ruler was treated with apparatus A. The data from the treatment of the ruler are summarized in Table 3h, below.

On runs 1, 3, 4, 5, and 7, a pinkish light interaction was observed during treatment, and on run 7 the surface was left with a slight pinkish cast. One possible explanation is that the substrate was damaged at the higher pulse power flux of approximately 20 to 26 MW/cm$^2$. Alternatively, the higher fluxes may have induced a change in the composition of the oxide layer to a composition more difficult to remove (i.e., with higher bond energies). This is consistent with the observation that more total energy flux was required in those runs to remove all of the oxide layer. In contrast, in runs 8–10, lower pulse power fluxes ranging from approximately TABLE 3h

| Run | Vl | Epm | Eps | Rl | vs | l | w | Feps | Fpps | Npl | Fepa | Npa | Fet | Comments | Rc |
|---|---|---|---|---|---|---|---|---|---|---|---|---|---|---|---|
| 1 | 17 | 168 | 99 | 30 | 1 | 23 | 3 | 0.14 | 4.2 | 90.0 | 12.87 | 1 | 12.87 | Removed | 1 |
| 2a | 17 | 180 | 106 | 30 | 5 | 23 | 3 | 0.15 | 4.5 | 18.0 | 2.76 | 1 | 2.76 | Partial removal | 3 |
| 2b | 18 | 303 | 175 | 30 | 5 | 23 | 3 | 0.25 | 7.5 | 18.0 | 4.56 | 1 | 4.56 | Partial removal | 3 |
| 2c | 20 | 441 | 246 | 30 | 5 | 23 | 3 | 0.36 | 10.5 | 18.0 | 6.42 | 1 | 6.42 | Removed | 2 |
| 3 | 19 | 387 | 220 | 30 | 3 | 23 | 3 | 0.32 | 9.4 | 30.0 | 9.55 | 1 | 9.55 | Removed | 1 |
| 4 | 19 | 396 | 225 | 30 | 10 | 23 | 3 | 0.33 | 9.6 | 9.0 | 2.93 | 1 | 2.93 | Removed | 1 |
| 5 | 19 | 396 | 225 | 30 | 20 | 23 | 3 | 0.33 | 9.6 | 4.5 | 1.47 | 1 | 1.47 | Removed little | 4 |
| 6 | 19 | 385 | 219 | 30 | 15 | 23 | 3 | 0.32 | 9.3 | 6.0 | 1.90 | 1 | 1.90 | Partial removal | 3 |
| 7 | 19 | 390 | 221 | 30 | 12 | 23 | 3 | 0.32 | 9.4 | 7.5 | 2.41 | 2 | 4.81 | 2 passes required | 2 |

The data indicate that the multi-photon bond power flux threshold was crossed between runs 2b and 2c–7 (thus being between approximately 7.5 and 9.3 MW/cm$^2$). Further, although $F_{pps}$ was sufficiently high in runs 5–7, the total energy flux $F_{et}$ was not high enough (at approximately 1.5 to 1.9 J/cm$^2$) to remove all the oxide.

h. Nickel/Iron Alloy Sputter Target

In this example, a sputter target was treated with Apparatus B. The sputter target was formed of an alloy of nickel and approximately 19% iron. The data from the treatment of the target are summarized in Table 3i, below.

9 to 10 MW/cm$^2$ were adequate to remove the oxidation (with approximately 1.3 or more J/cm$^2$ total energy flux $F_{et}$).

i. Nickel Alloy Strip

In this example, a strip of oxidized nickel alloy was treated with Apparatus A. The nickel alloy was of an undetermined composition. The data from the treatment of the strip are summarized in Table 3j, below.

TABLE 3i

| Run | Vl | Epm | Eps | Rl | vs | l | w | Feps | Fpps | Npl | Fepa | Npa | Fet | Comments | Rc |
|---|---|---|---|---|---|---|---|---|---|---|---|---|---|---|---|
| 1 | 18 | 267 | 138 | 30 | 7 | 23 | 0.9 | 0.67 | 19.7 | 3.9 | 2.58 | 2 | 5.16 | 2 passes removed all | 2 |
| 3 | 20 | 354 | 175 | 30 | 7 | 23 | 0.9 | 0.84 | 24.8 | 3.9 | 3.25 | 2 | 6.51 | 2 passes removed all | 2 |
| 4 | 20 | 354 | 175 | 30 | 7 | 23 | 0.9 | 0.84 | 24.8 | 3.9 | 3.25 | 3 | 9.76 | 3 passes removed all | 3 |
| 5 | 20 | 363 | 176 | 30 | 10 | 23 | 0.9 | 0.85 | 25.0 | 2.7 | 2.30 | 3 | 6.90 | 3 passes removed all | 3 |
| 7 | 20 | 387 | 188 | 30 | 12 | 23 | 0.9 | 0.91 | 26.7 | 2.3 | 2.04 | 4 | 8.17 | 4 passes, pinkish surface | 5 |
| 8 | 20 | 375 | 182 | 30 | 12 | 23 | 2.5 | 0.32 | 9.3 | 6.3 | 1.98 | 2 | 3.96 | 2 passes removed all | 2 |
| 9 | 20 | 387 | 188 | 30 | 15 | 23 | 2.5 | 0.33 | 9.6 | 5.0 | 1.63 | 1 | 1.63 | 1 pass removed all | 1 |
| 10 | 21 | 426 | 200 | 30 | 20 | 23 | 2.5 | 0.35 | 10.2 | 3.8 | 1.31 | 1 | 1.31 | 1 pass removed all | 1 |

TABLE 3j

| Run | VI | Epm | Eps | RI | vs | I | w | Feps | Fpps | NpI | Fepa | Npa | Fet | Comments | Rc |
|---|---|---|---|---|---|---|---|---|---|---|---|---|---|---|---|
| 1 | 20 | 397 | 224 | 30 | 2 | 23 | 0.5 | 1.94 | 57.2 | 10.0 | 19.44 | 1 | 19.4 | 1 pass | 5 |
| 2 | 22 | 485 | 262 | 30 | 2 | 23 | 0.5 | 2.28 | 67.1 | 10.0 | 22.80 | 1 | 22.8 | 1 pass | 5 |
| 3 | 22 | 489 | 264 | 30 | 2 | 23 | 0.5 | 2.30 | 67.6 | 10.0 | 22.99 | 1 | 23.0 | 1 pass | 5 |
| 4 | 22 | 489 | 264 | 30 | 1 | 23 | 0.5 | 2.30 | 67.6 | 15.0 | 34.48 | 3 | 103.4 | 3 passes, brown residue | 5 |
| 5 | 19 | 378 | 215 | 30 | 1 | 23 | 0.5 | 1.87 | 54.9 | 15.0 | 27.99 | 1 | 28.0 | 1 pass, partial removal | 5 |
| 7 | 20 | 414 | 231 | 30 | 1 | 23 | 0.82 | 1.23 | 36.1 | 24.6 | 30.16 | 7 | 211.1 | 7 passes, removal by layers | 2 |
| 6a | 20 | 438 | 243 | 30 | 1 | 23 | 0.82 | 1.29 | 38.0 | 24.6 | 31.74 | 1 | 31.7 | 1 pass, partial removal | 3 |
| 6b | 21 | 462 | 254 | 30 | 1 | 23 | 0.82 | 1.35 | 39.6 | 24.6 | 33.10 | 1 | 33.1 | 1 pass, oxide remaining (6a) | 2 |

Visual observation of run 4 revealed a brownish residue, perhaps indicative of damage to the remaining material. Visual inspection of run 7 between passes indicated that the oxide was removed incrementally on each pass. Further, it appears that the multi-photon bond power flux threshold is approximately 50 MW/cm$^2$—some cleaning was achieved at lower values of $F_{pps}$, but higher values of $F_{et}$ were required to remove all oxide.

j. Copper Penny

In this example, oxidized U.S. pennies (copper) were treated with Apparatus B. Three pennies were treated, with one run made on each of the obverse and reverse sides of each penny (the runs are paired for each coin—runs 1 and 2 are for the same coin, 3 and 4 for the next, etc.). The data from the treatment of the pennies are summarized in Table 3k, below.

TABLE 3k

| Run | VI | Epm | Eps | RI | vs | I | w | Feps | Fpps | NpI | Fepa | Npa | Fet | Comments | Rc |
|---|---|---|---|---|---|---|---|---|---|---|---|---|---|---|---|
| 1 | 20 | 348 | 169 | 30 | 5 | 23 | 2.1 | 0.35 | 10.3 | 12.6 | 4.41 | 4 | 17.6 | Removed in 4 passes | 3 |
| 2 | 18 | 243 | 126 | 30 | 5 | 23 | 2.1 | 0.26 | 7.7 | 12.6 | 3.29 | 4 | 13.2 | Removed in 4 passes | 3 |
| 3 | 19 | 306 | 153 | 30 | 5 | 23 | 2.1 | 0.32 | 9.3 | 12.6 | 4.00 | 15 | 60.0 | 15 passes/Patina VG | 3 |
| 4 | 20 | 351 | 170 | 30 | 5 | 23 | 2.1 | 0.35 | 10.4 | 12.6 | 4.44 | 30 | 133.3 | 30 passes/patina VG | 3 |
| 5 | 20 | 348 | 169 | 30 | 5 | 23 | 1.1 | 0.67 | 19.6 | 6.6 | 4.41 | 15 | 66.1 | 15 passes/Patina VG | 3 |
| 6 | 20 | 348 | 169 | 30 | 5 | 23 | 1.1 | 0.67 | 19.6 | 6.6 | 4.41 | 15 | 66.1 | Damaged/15 passes | 6 |

These data show effective removal of copper oxide at pulse power flux levels of approximately 8 to 20 MW/cm$^2$ (requiring total energies of approximately 13 to 130 J/cm$^2$ to remove all or nearly all of the oxide), while higher pulse power fluxes (20 MW/cm$^2$ in run 6) may damage the surface.

k. Nickel Alloy Quarter Dollar

In this example, oxidized U.S. quarter dollar coins (with nickel alloy surface layer) were treated with Apparatus B. Two quarters were treated, with one run made on each of the obverse and reverse sides of each quarter (as above, runs 1 and 2 are for the two sides of one coin, and 3 and 4 for the other). The data from the treatment of the quarters are summarized in Table 3l, below.

These data show that the oxide layer on the nickel alloy surface of the quarters was effectively removed at pulse power fluxes of approximately 10 to 11 MW/cm$^2$, in 1 to 4 passes.

4. Removal of Organic Films

The application of the treatment method and apparatus described above with regard to organic films is illustrated in the following examples. Unless otherwise noted, the tests were conducted in the same manner, and the data shown is in the same format and units, as the oxidation film removal examples. All tests were conducted with Apparatus A.

a. Paint on Stainless Steel

In this example, a 304 stainless steel disk with an Ra finish of 20 was coated (by spraying) with conventional metal- TABLE 3l

| Run | VI | Epm | Eps | RI | vs | I | w | Feps | Fpps | NpI | Fepa | Npa | Fet | Comments | Rc |
|---|---|---|---|---|---|---|---|---|---|---|---|---|---|---|---|
| 1 | 21 | 384 | 181 | 30 | 5 | 23 | 2.1 | 0.37 | 11.0 | 12.6 | 4.71 | 2 | 9.4 | 1 pass removed, 2nd not required | 1 |
| 2 | 21 | 378 | 178 | 30 | 5 | 23 | 2.1 | 0.37 | 10.8 | 12.6 | 4.64 | 4 | 18.6 | Removed in 4 passes | 3 |
| 3 | 21 | 348 | 164 | 30 | 5 | 23 | 2.1 | 0.34 | 10.0 | 12.6 | 4.27 | 3 | 12.8 | Removed in 3 passes | 3 |
| 4 | 21 | 348 | 164 | 30 | 5 | 23 | 2.1 | 0.34 | 10.0 | 12.6 | 4.27 | 3 | 12.8 | Removed in 3 passes | 3 | application paint (in this case, paint sold under the trade name "RUSTOLEUM"). The results of the treatment are summarized in Table 4a, below.

TABLE 4a

| Run | VI | Epm | Eps | RI | vs | I | w | Feps | Fpps | NpI | Fepa | Npa | Fet | Comments | Rc |
|---|---|---|---|---|---|---|---|---|---|---|---|---|---|---|---|
| 1 | 18 | 318 | 183 | 30 | 3 | 23 | 1.00 | 0.80 | 23.4 | 10.0 | 7.97 | 2 | 15.9 | 2 passes | 2 |
| 3 | 18 | 315 | 182 | 30 | 3 | 23 | 1.00 | 0.79 | 23.2 | 10.0 | 7.89 | 2 | 15.8 | 2 passes | 2 |
| 5 | 22 | 501 | 271 | 30 | 3 | 23 | 1.00 | 1.18 | 34.6 | 10.0 | 11.78 | 3 | 35.3 | 3 passes | 3 |
| 8 | 18 | 318 | 184 | 30 | 1 | 23 | 1.00 | 0.80 | 23.5 | 30.0 | 23.95 | 2 | 47.9 | 2 passes | 2 |
| 9 | 18 | 318 | 184 | 30 | 1 | 23 | 3.00 | 0.27 | 7.8 | 90.0 | 23.95 | 7 | 167.6 | 7 passes | 3,4 |
| 10 | 22 | 510 | 276 | 30 | 3 | 23 | 3.00 | 0.40 | 11.8 | 30.0 | 11.99 | 2 | 24.0 | 2 passes | 2 |
| 11 | 22 | 510 | 276 | 30 | 2 | 23 | 3.00 | 0.40 | 11.8 | 45.0 | 17.98 | 2 | 36.0 | 2 passes | 2 |
| 12 | 22 | 516 | 279 | 30 | 2 | 23 | 3.00 | 0.40 | 11.9 | 45.0 | 18.19 | 2 | 36.4 | 2 passes | 2 |
| 13 | 22 | 522 | 282 | 30 | 2 | 23 | 3.00 | 0.41 | 12.0 | 60.0 | 24.54 | 1 | 24.5 | 1 pass removed | 1 |
| 14 | 22 | 522 | 282 | 30 | 2 | 23 | 3.00 | 0.41 | 12.0 | 52.9 | 21.65 | 1 | 21.7 | 1 pass removed | 1 |
| 15 | 22 | 522 | 282 | 30 | 2 | 23 | 3.00 | 0.41 | 12.0 | 56.3 | 23.01 | 1 | 23.0 | 1 pass removed | 1 |
| 16 | 22 | 522 | 282 | 30 | 2 | 23 | 2.10 | 0.58 | 17.2 | 39.4 | 23.01 | 1 | 23.0 | 1 pass removed | 1 |
| 17 | 22 | 522 | 282 | 30 | 3 | 23 | 2.10 | 0.58 | 17.2 | 21.0 | 12.27 | 3 | 36.8 | 3 passes | 3 |
| 18 | 22 | 522 | 282 | 30 | 2 | 23 | 3.00 | 0.41 | 12.0 | 50.0 | 20.45 | 1 | 20.4 | 1 pass removed | 1 |

These data indicate that a relatively thick organic film can be effectively removed from a stainless steel substrate with no observed damage to the substrate. It appears that the paint film required a total energy flux ($F_{et}$) of at least approximately 16 J/cm$^2$, and more total energy (167 J/cm$^2$) at a lower pulse power flux (approximately 8 MW/cm$^2$ in run 9). This may also be indicative of a power flux threshold of between 8 and 12 MW/cm$^2$.

b. Organic Films on Quartz Wafer Boat

In this example, various organic films were applied to the surface of a generally cylindrical, slotted, quartz wafer boat (used to transport semiconductor wafers through furnaces). Three types of organic films were applied: fingerprints (human body oil); paint (blue and red); and "magic marker." The quartz wafer boat was then treated with Apparatus A. The results of the treatment are summarized in Table 4b, below.

TABLE 4b

| Run | VI | Epm | Eps | RI | vs | I | w | Feps | Fpps | NpI | Fepa | Npa | Fet | Comments | Rc |
|---|---|---|---|---|---|---|---|---|---|---|---|---|---|---|---|
| Sample 1 = Fingerprint | | | | | | | | | | | | | | | |
| 7 | 18 | 388 | 224 | 30 | 3 | 23 | 4.4 | 0.22 | 6.5 | 44.0 | 9.74 | 2 | 19.48 | Residual left | 2 |
| 8 | 18 | 285 | 165 | 30 | 2 | 23 | 4.4 | 0.16 | 4.8 | 66.0 | 10.73 | 2 | 21.46 | Residual left | 2 |
| 9 | 20 | 396 | 221 | 30 | 2 | 23 | 4 | 0.24 | 7.1 | 60.0 | 14.42 | 2 | 28.84 | Residual left | 2 |
| 10 | 22 | 450 | 243 | 30 | 2 | 23 | 4 | 0.26 | 7.8 | 60.0 | 15.87 | 1 | 15.87 | Fingerprint removed | 1 |
| 12 | 18 | 273 | 158 | 30 | 1 | 23 | 2.2 | 0.31 | 9.2 | 66.0 | 20.56 | 1 | 20.56 | Fingerprint removed | 1 |
| 13 | 18 | 273 | 158 | 30 | 3 | 23 | 2.2 | 0.31 | 9.2 | 22.0 | 6.85 | 2 | 13.71 | Residual left | 2 |
| 15 | 18 | 273 | 158 | 30 | 2 | 23 | 2.2 | 0.31 | 9.2 | 33.0 | 10.28 | 1 | 10.28 | Fingerprint removed | 1 |
| Sample 2 = paint (blue) | | | | | | | | | | | | | | | |
| 1 | 18 | 300 | 173 | 30 | 2 | 23 | 2.2 | 0.34 | 10.1 | 33.0 | 11.30 | 1 | 11.30 | Red paint removed | 1 |
| 2 | 18 | 300 | 173 | 30 | 2 | 23 | 2.2 | 0.34 | 10.1 | 33.0 | 11.30 | 1 | 11.30 | Red paint removed | 1 |
| 3 | 18 | 300 | 173 | 30 | 6 | 23 | 2.2 | 0.34 | 10.1 | 11.0 | 3.77 | 1 | 3.77 | Red paint removed | 1 |
| Sample 3 = Marker | | | | | | | | | | | | | | | |
| 4 | 18 | 300 | 173 | 30 | 6 | 23 | 2.2 | 0.34 | 10.1 | 11.0 | 3.77 | 2 | 7.53 | Two passes required | 2 |
| 5 | 18 | 300 | 173 | 30 | 4 | 23 | 2.2 | 0.34 | 10.1 | 16.5 | 5.65 | 2 | 11.30 | Two passes required | 2 |
| 6 | 18 | 360 | 208 | 30 | 4 | 23 | 2.2 | 0.41 | 12.1 | 16.5 | 6.78 | 2 | 13.55 | Two passes required | 2 |
| 7 | 22 | 561 | 303 | 30 | 4 | 23 | 3.4 | 0.39 | 11.4 | 25.5 | 9.89 | 2 | 19.78 | Two passes required | 2 |
| Sample 4 = paint (blue) | | | | | | | | | | | | | | | |
| 10 | 18 | 300 | 174 | 30 | 7 | 23 | 0.5 | 1.51 | 44.4 | 2.3 | 3.49 | 1 | 3.49 | Blue paint removed | 1 |
| 12 | 18 | 324 | 187 | 30 | 10 | 23 | 0.5 | 1.63 | 47.8 | 1.5 | 2.44 | 1 | 2.44 | Blue paint removed | 1 |
| Sample 5 = fingerprint | | | | | | | | | | | | | | | |
| 13 | 18 | 320 | 185 | 30 | 10 | 23 | 0.5 | 1.61 | 47.2 | 1.5 | 2.41 | 2 | 4.82 | Residual observed | 2 |
| 14 | 18 | 324 | 187 | 30 | 7 | 23 | 0.5 | 1.63 | 47.8 | 2.1 | 3.49 | 1 | 3.49 | Fingerprint removed | 1 |

These data indicate that the organic films can be effectively removed without damage to the quartz substrate, at various energy levels in one or more passes.

c. Organic Films on Fused Silica Quartz Window

In this example, various organic films were applied to the surface of a generally planar, fused silica quartz optical window. Two types of organic films were applied: fingerprints (human body oil), with and without additional dust; and blue paint. The window was then treated with Apparatus A. The results of the treatment are summarized in Table 4c, below.

TABLE 4c

| Run | VI | Epm | Eps | RI | vs | I | w | Feps | Fpps | NpI | Fepa | Npa | Fet | Comments | Rc |
|---|---|---|---|---|---|---|---|---|---|---|---|---|---|---|---|
| Sample 1 = Fingerprint/dust | | | | | | | | | | | | | | | |
| 1 | 18 | 336 | 194 | 30 | 4 | 23 | 3.5 | 0.24 | 7.1 | 26.3 | 6.33 | 1 | 6.33 | Dust removed, residual FP | 1 |
| 2 | 19 | 435 | 247 | 30 | 4 | 23 | 3.5 | 0.31 | 9.0 | 26.3 | 8.05 | 1 | 8.05 | Better removal observed | 5 |
| 3 | 19 | 400 | 228 | 30 | 4 | 23 | 1.8 | 0.55 | 16.2 | 13.5 | 7.44 | 1 | 7.44 | | 6 |
| 1 | 22 | 546 | 295 | 30 | 5 | 23 | 1.8 | 0.71 | 21.0 | 10.8 | 7.70 | 2 | 15.40 | Some residual | 2 |
| 2 | 22 | 549 | 297 | 30 | 5 | 23 | 1 | 1.29 | 38.0 | 6.0 | 7.74 | 2 | 15.49 | Some residual | 2 |
| 4 | 22 | 546 | 295 | 30 | 5 | 23 | 0.5 | 2.57 | 75.5 | 3.0 | 7.70 | 1 | 7.70 | FP and dust removed | 1 |
| 5 | 22 | 529 | 286 | 30 | 10 | 23 | 0.5 | 2.49 | 73.1 | 1.5 | 3.73 | 2 | 7.46 | Some residual | 2 |
| 6 | 22 | 549 | 297 | 30 | 7 | 23 | 0.5 | 2.58 | 75.9 | 2.1 | 5.53 | 2 | 11.06 | Some residual, 90% removed | 2 |
| 7 | 22 | 549 | 297 | 30 | 7 | 23 | 0.5 | 2.58 | 75.9 | 2.3 | 5.96 | 1 | 5.96 | FP and dust removed | 1 |
| 8 | 18 | 348 | 201 | 30 | 7 | 23 | 0.5 | 1.74 | 51.3 | 2.3 | 4.02 | 2 | 8.05 | Residual FP | 2 |
| 8a | 19 | 420 | 239 | 30 | 7 | 23 | 0.5 | 2.08 | 61.2 | 2.3 | 4.80 | 2 | 9.60 | FP residual | 2 |
| 9 | 20 | 480 | 268 | 30 | 7 | 23 | 0.5 | 2.33 | 68.5 | 2.3 | 5.38 | 2 | 10.76 | Some FP residual | 2 |
| Sample 2 = Paint (blue) | | | | | | | | | | | | | | | |
| 10 | 18 | 300 | 174 | 30 | 7 | 23 | 0.5 | 1.51 | 44.4 | 2.3 | 3.49 | 1 | 3.49 | Blue paint removed | 1 |
| 12 | 18 | 324 | 187 | 30 | 10 | 23 | 0.5 | 1.63 | 47.8 | 1.5 | 2.44 | 1 | 2.44 | Blue paint removed | 1 |
| Sample 3 = Fingerprint | | | | | | | | | | | | | | | |
| 13 | 18 | 320 | 185 | 30 | 10 | 23 | 0.5 | 1.61 | 47.2 | 1.5 | 2.41 | 2 | 4.82 | Some residual | 2 |
| 14 | 18 | 324 | 187 | 30 | 7 | 23 | 0.5 | 1.63 | 47.8 | 2.1 | 3.49 | 1 | 3.49 | Fingerprint removed | 1 |

These data again show that the organic films can be effectively removed without damage to the quartz substrate, at various energy levels in one or more passes.

5. Removal of Polycrystalline Silicon from Quartz

The application of the treatment method and apparatus described above with regard to polycrystalline silicon on quartz is illustrated in the following examples. The interior surface of a cylindrical quartz furnace tube was treated to remove a layer of polycrystalline silicon that recondensed on the surface during treatment of silicon dies passed through the furnace tube. A partial radial section of the tube was treated with Apparatus A. A series of test runs was conducted, the results of which are shown in Table 5a, below. In the test apparatus, incident region 611 was continuously scanned across a swath 612 with a width (X dimension) of between 0.9 and 2.0 mm for scan times as long as tens of minutes. The number of passes ($N_{pa}$) shown in Table 5a is therefore:

$$N_{pa} = \frac{t_{scan} \cdot V_s}{w_{swath}} \quad \text{Equation 9}$$

where $w_{swath}$ is the width of the swath 612, $t_{scan}$ is the time duration of the scan, and $V_s$ is the laser scan velocity.

It was observed that at high energy and power flux levels, the point at which the polycrystalline silicon layer was completely removed, and the quartz thus exposed to the radiation, was accompanied by fluorescence of the quartz. This provided a convenient visual indicator of the time at which breakthrough was achieved.

TABLE 5a

| Run | VI | Epm | Eps | RI | vs | I | w | Feps | Fpps | NpI | Fepa | Npa | Fet | Comments | Rc |
|---|---|---|---|---|---|---|---|---|---|---|---|---|---|---|---|
| 5,67 | 21 | 507 | 280 | 30 | 1 | 23 | 0.37 | 3.29 | 97 | 22.2 | 73.01 | 2595 | 189438 | Observe reduction of Si film | 5 |
| 8 | 21 | 507 | 281 | 30 | 1 | 23 | 0.37 | 3.30 | 97 | 22.2 | 73.25 | 3405 | 249447 | Fluorescense; surface roughened | 5 |
| 9 | 22 | 535 | 289 | 30 | 1 | 23 | 0.25 | 5.13 | 151 | 7.4 | 37.73 | 14694 | 554348 | Layers removed from quartz | 5 |
| 10 | 22 | 540 | 292 | 30 | 3 | 23 | 0.25 | 5.18 | 152 | 2.5 | 12.69 | 2204 | 27976 | | 5 |
| 11 | 20 | 534 | 298 | 30 | 3 | 23 | 0.3 | 4.32 | 127 | 3.0 | 12.96 | 3000 | 38892 | Thinning of Si film | 5 |
| 11a | 20 | 546 | 305 | 30 | 3 | 23 | 0.3 | 4.42 | 130 | 3.0 | 13.26 | 4200 | 55673 | Quartz damaged at 6.3 min | 5 |
| 11b | 19 | 399 | 227 | 30 | 3 | 23 | 0.3 | 3.29 | 97 | 3.0 | 9.88 | 9000 | 88932 | Thinning of Si film | 5 |
| 11c | 19 | 405 | 231 | 30 | 3 | 23 | 0.3 | 3.34 | 98 | 3.0 | 10.03 | 1350 | 13540 | Some quartz damage | 5 |
| 11d | 18 | 351 | 203 | 30 | 3 | 23 | 0.3 | 2.94 | 86 | 3.0 | 8.81 | 4350 | 38326 | Good removal rate | 5 |
| 12a | 18 | 537 | 310 | 30 | 3 | 23 | 0.25 | 5.50 | 162 | 2.5 | 13.48 | 1800 | 24263 | | 5 |
| 12b | 18 | 450 | 260 | 30 | 3 | 23 | 0.25 | 4.61 | 136 | 2.5 | 11.30 | 4430 | 50042 | Fluorescense | 5 |
| 12c | 18 | 400 | 231 | 30 | 3 | 23 | 0.25 | 4.10 | 121 | 2.5 | 10.04 | 3504 | 35187 | Significant Si removal | 5 |
| 12d | 18 | 396 | 229 | 30 | 3 | 23 | 0.25 | 4.06 | 119 | 2.5 | 9.94 | 1550 | 15409 | Some quartz damage | 5 |
| 12e | 18 | 375 | 217 | 30 | 3 | 23 | 0.25 | 3.84 | 113 | 2.5 | 9.41 | 617 | 5809 | | 5 |
| 12f | 18 | 375 | 217 | 30 | 3 | 23 | 0.25 | 3.84 | 113 | 2.5 | 9.41 | 3130 | 29461 | | 5 |
| 12g | 18 | 375 | 217 | 30 | 3 | 23 | 0.25 | 3.84 | 113 | 2.5 | 9.41 | 3321 | 31259 | | 5 |
| 12h | 18 | 375 | 217 | 30 | 3 | 23 | 0.25 | 3.84 | 113 | 2.5 | 9.41 | 367 | 3458 | | 5 |
| 12i | 18 | 375 | 217 | 30 | 3 | 23 | 0.25 | 3.84 | 113 | 2.5 | 9.41 | 1102 | 10374 | | 5 |
| 12j | 18 | 375 | 217 | 30 | 3 | 23 | 0.25 | 3.84 | 113 | 2.5 | 9.41 | 1638 | 15422 | | 5 |
| 13a | 18 | 528 | 305 | 30 | 3 | 15 | 0.24 | 8.47 | 249 | 2.4 | 20.32 | 1275 | 25911 | | 5 |
| 13b | 18 | 452 | 261 | 30 | 3 | 15 | 0.24 | 7.25 | 213 | 2.4 | 17.40 | 1650 | 28705 | Significant Si removal | 5 |

TABLE 5a-continued

| Run | VI | Epm | Eps | RI | vs | I | w | Feps | Fpps | NpI | Fepa | Npa | Fet | Comments | Rc |
|---|---|---|---|---|---|---|---|---|---|---|---|---|---|---|---|
| 13c | 18 | 441 | 255 | 30 | 3 | 15 | 0.24 | 7.07 | 208 | 2.4 | 16.97 | 825 | 14003 | | 5 |
| 13d | 18 | 447 | 258 | 30 | 3 | 15 | 0.24 | 7.17 | 211 | 2.4 | 17.20 | 1403 | 24129 | | 5 |
| 13e | 18 | 447 | 258 | 30 | 3 | 15 | 0.24 | 7.17 | 211 | 2.4 | 17.20 | 263 | 4516 | | 5 |
| 13f | 18 | 447 | 258 | 30 | 3 | 15 | 0.24 | 7.17 | 211 | 2.4 | 17.20 | 2385 | 41033 | Significant Si removal | 5 |
| 13g | 18 | 372 | 215 | 30 | 3 | 15 | 0.24 | 5.97 | 175 | 2.4 | 14.32 | 1088 | 15571 | | 5 |
| 13h | 18 | 372 | 215 | 30 | 3 | 15 | 0.24 | 5.97 | 175 | 2.4 | 14.32 | 1260 | 18041 | | 5 |
| 13i | 18 | 342 | 197 | 30 | 3 | 15 | 0.24 | 5.48 | 161 | 2.4 | 13.16 | 2228 | 29321 | Si removed completely | 5 |
| 14a | 23 | 525 | 282 | 30 | 3 | 15 | 0.24 | 7.82 | 230 | 2.4 | 18.77 | 1238 | 23231 | | 5 |
| 14b | 23 | 525 | 282 | 30 | 3 | 15 | 0.24 | 7.82 | 230 | 2.4 | 18.77 | 300 | 5632 | | 5 |
| 14c | 23 | 525 | 282 | 30 | 3 | 15 | 0.24 | 7.82 | 230 | 2.4 | 18.77 | 323 | 6054 | | 5 |
| 14d | 23 | 525 | 282 | 30 | 3 | 15 | 0.24 | 7.82 | 230 | 2.4 | 18.77 | 518 | 9715 | | 5 |
| 14e | 23 | 525 | 282 | 30 | 3 | 15 | 0.24 | 7.82 | 230 | 2.4 | 18.77 | 525 | 9856 | | 5 |
| 14f | 23 | 525 | 282 | 30 | 3 | 15 | 0.24 | 7.82 | 230 | 2.4 | 18.77 | 150 | 2816 | | 5 |
| 14g | 23 | 525 | 282 | 30 | 3 | 15 | 0.24 | 7.82 | 230 | 2.4 | 18.77 | 503 | 9433 | | 5 |
| 14h | 23 | 525 | 282 | 30 | 3 | 15 | 0.24 | 7.82 | 230 | 2.4 | 18.77 | 150 | 2816 | | 5 |
| 14i | 23 | 525 | 282 | 30 | 3 | 15 | 0.24 | 7.82 | 230 | 2.4 | 18.77 | 630 | 11827 | | 5 |
| 14j | 23 | 525 | 282 | 30 | 3 | 15 | 0.24 | 7.82 | 230 | 2.4 | 18.77 | 120 | 2253 | | 5 |
| 14k | 23 | 525 | 282 | 30 | 3 | 15 | 0.24 | 7.82 | 230 | 2.4 | 18.77 | 75 | 1408 | | 5 |
| 14l | 23 | 525 | 282 | 30 | 3 | 15 | 0.24 | 7.82 | 230 | 2.4 | 18.77 | 83 | 1549 | | 5 |
| 14m | 23 | 525 | 282 | 30 | 3 | 15 | 0.24 | 7.82 | 230 | 2.4 | 18.77 | 75 | 1408 | | 5 |
| 14n | 23 | 525 | 282 | 30 | 3 | 15 | 0.24 | 7.82 | 230 | 2.4 | 18.77 | 90 | 1690 | Si removed completely | 5 |
| 14a2 | 19 | 399 | 225 | 30 | 5 | 15 | 0.24 | 6.26 | 184 | 1.4 | 9.02 | 1763 | 15890 | | 5 |
| b2 | 19 | 342 | 196 | 30 | 5 | 15 | 0.24 | 5.44 | 160 | 1.4 | 7.83 | 2500 | 19579 | Large area of Si removed | 5 |
| c2 | 18 | 297 | 172 | 30 | 5 | 15 | 0.24 | 4.77 | 140 | 1.4 | 6.87 | 7350 | 50497 | Thinning of Si film | 5 |
| d2 | 18 | 318 | 183 | 30 | 5 | 15 | 0.24 | 5.09 | 150 | 1.4 | 7.33 | 1650 | 12097 | | 5 |
| e2 | 18 | 318 | 183 | 30 | 5 | 15 | 0.24 | 5.09 | 150 | 1.4 | 7.33 | 1800 | 13196 | | 5 |
| f2 | 18 | 318 | 183 | 30 | 5 | 15 | 0.24 | 5.09 | 150 | 1.4 | 7.33 | 2700 | 19794 | Thinning of Si film | 5 |

The data indicate that polycrystalline silicon can be removed from the surface of quartz.

6. Surface Topography Modification

From the description and data presented above, it is evident that substantially continuous layers of material can be selectively removed from a substrate surface. The thickness of material removed from the substrate is a function of the bond energies of the material to be removed, the energy (wavelength) of the applied photons, the energy flux of the applied photons and, for multi-photon bonds, the power flux. Energy and power fluxes can be also be referred to as a spatial and temporal concentration of the applied photons. For a given material, it is therefore possible to determine the temporal and spatial photon concentration required to remove a layer of the material of a desired thickness. As described above for oxidation and organic and inorganic film layers, the layers of material can be removed uniformly over an extensive area of substrate by scanning the radiation across the substrate surface. However, by suitably controlling the removal process, it is possible to selectively (e.g., non-uniformly) remove material from relatively small areas to modify the topography of the substrate surface. The topography modification may be in the nature of micromachining to create nanostructures or may be to planarize a rough surface.

a. Creation of Nanostructures

Nanostructures can be built up by selectively removing substrate material from around structures that are to be elevated above the surrounding surface. This can be done in two ways. The first is conceptually equivalent to a milling operation on conventional structure scales. To continue this analogy, the incident radiation region 611 can be considered to be the milling tool, with the size of region 611 (corresponding to the size of the milling tool) dictating the smallest width of material that can be removed. Similarly, the lateral resolution of the control over the movement of region 611 (whether by traversing a stage such as 610 or moving focusing optics) dictates the scale and accuracy with which structures can be created. The depth of the "cut" achieved on each "pass" of the incident region is dictated by the energy and power fluxes, and the total depth of material removed is further controlled by the number of passes made over the surface.

Figure 4:
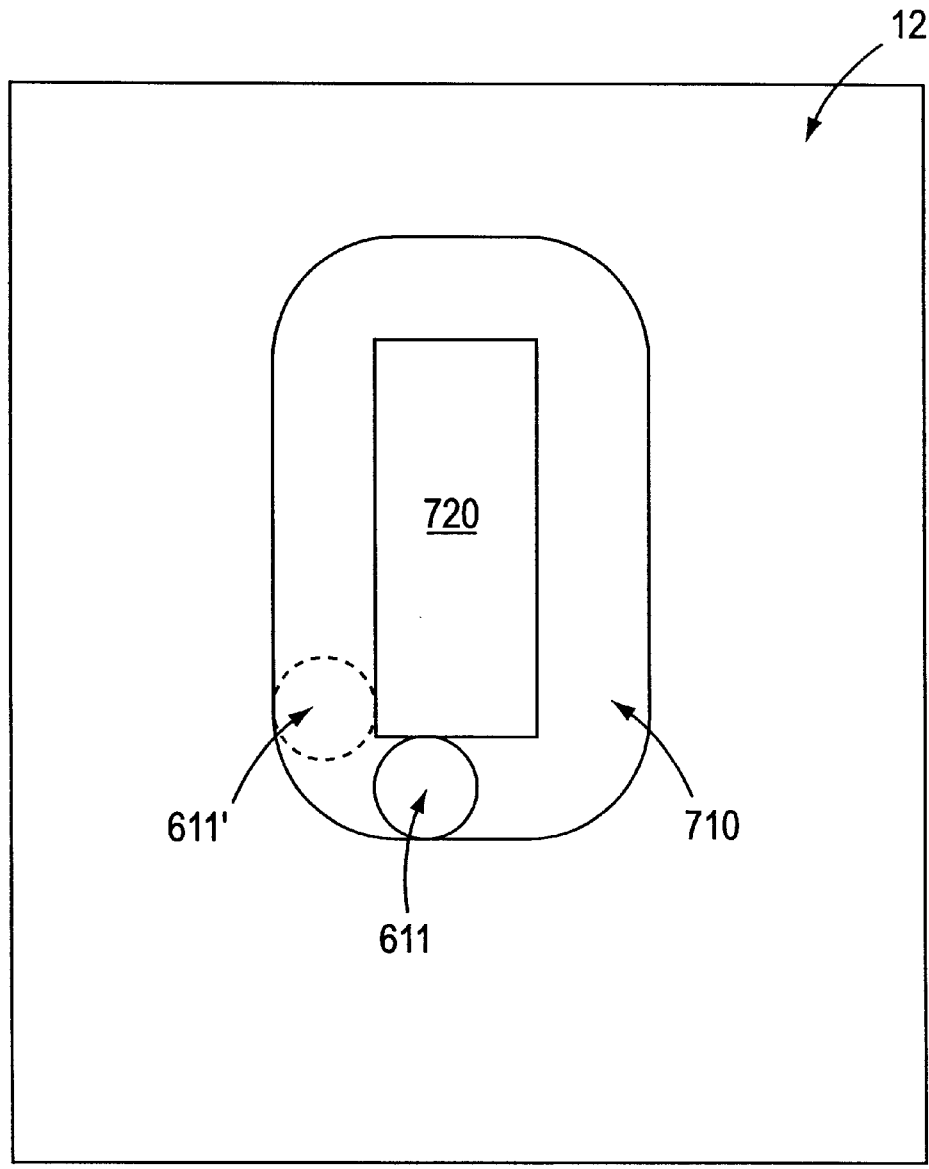
FIG. 4 is a schematic illustration of a technique for selectively removing material from a substrate to create nanostructures.

The creation of a simple nanostructure is illustrated schematically in FIG. 4. The nanostructure is an "island" 720 surrounded by a "trench" 710 formed in the surface of substrate 12. Trench 710 is formed by traversing incident radiation region 611 (shown schematically as a circular region, although it may be rectangular as illustrated in the experimental apparatus above) around the perimeter of the region in which island 720 is desired to be created. The traversal of region 611 is indicated by another position of the region (611') in another portion of the trench 710.

An alternative micromachining technique is to use a mask to define the areas of material to be removed, overlay the mask on or above the substrate treatment surface, and scan the incident radiation region uniformly across the mask. Of course, the mask and substrate materials must be selected, and the photon power and energy flux levels set, to remove the undesired material from the substrate treatment surface without damaging the mask so much as to render it unusable before the substrate micromachining is completed.

Techniques for the use of masks (such as for photolithography) and the control over laser incident region size and position have been demonstrated in the prior art to be controllable on the spatial scale of interest in the micromachining of nanostructures. The way in which those techniques would be applied to use the present invention for micromachining will therefore be evident to the artisan and are not described in more detail here.

b. Planarization

Figure 5:
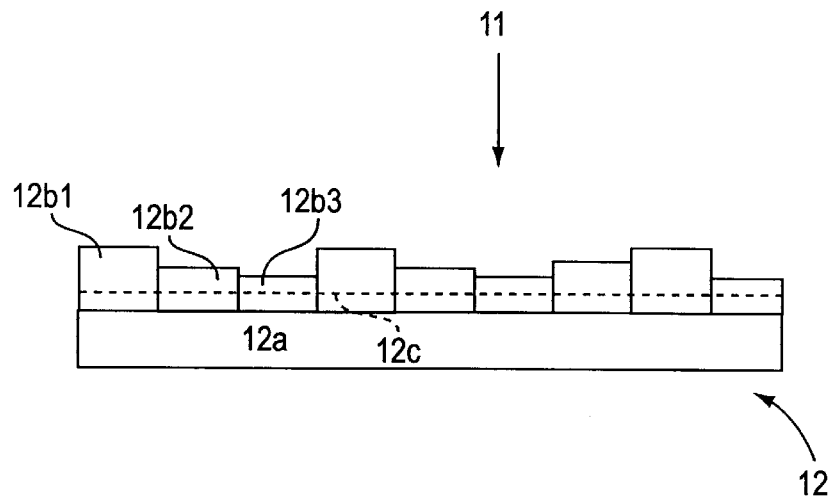
FIG. 5 is a schematic illustration of a substrate prior to the process of planarization.

A substrate surface may also be "planarized" by selective application of radiation, as illustrated schematically in FIG. 5. If, as shown in FIG. 5, the substrate 12 has a layer 12*b* (such as an oxide layer, although the layer may simply be a surface layer of the substrate) that is non-uniform in thickness (indicated by regions 12*b*1, 12*b*2, 12*b*3, etc.), it may be desirable in certain applications to remove some, but not all, of the oxide layer, and to make the oxide layer a more uniform thickness (indicated by dashed line 12c). This can be accomplished by selective application of the radiation to each of the regions 12b1, etc. to remove a thickness of material equal to the difference between the pre-treatment thickness and the desired thickness. The radiation can be scanned in raster fashion across the surface of the substrate, and the desired amount of material removed from each region.

To accurately determine the pre-treatment thickness of layer 12b (and, optionally, to confirm the desired post-treatment thickness), it is desirable to use an in-situ film thickness measurement technique. Suitable known techniques include reflection or beam profile spectrophotometry or ellipsometry. (Such techniques are described in P. Burggraaf, "Thin Film Metrology: Headed for a New Plateau" *Semiconductor International* March 1994). An actual thickness in each region can then be compared to the desired thickness to determine a thickness of undesired material. The appropriate radiation energy and power fluxes can then be applied to the region to eliminate the thickness of undesired material. A post-treatment thickness measurement can be made to confirm that the actual thickness is equal to the desired thickness, and an additional treatment applied if required. This process can be continued iteratively for each region.

Figure 6:
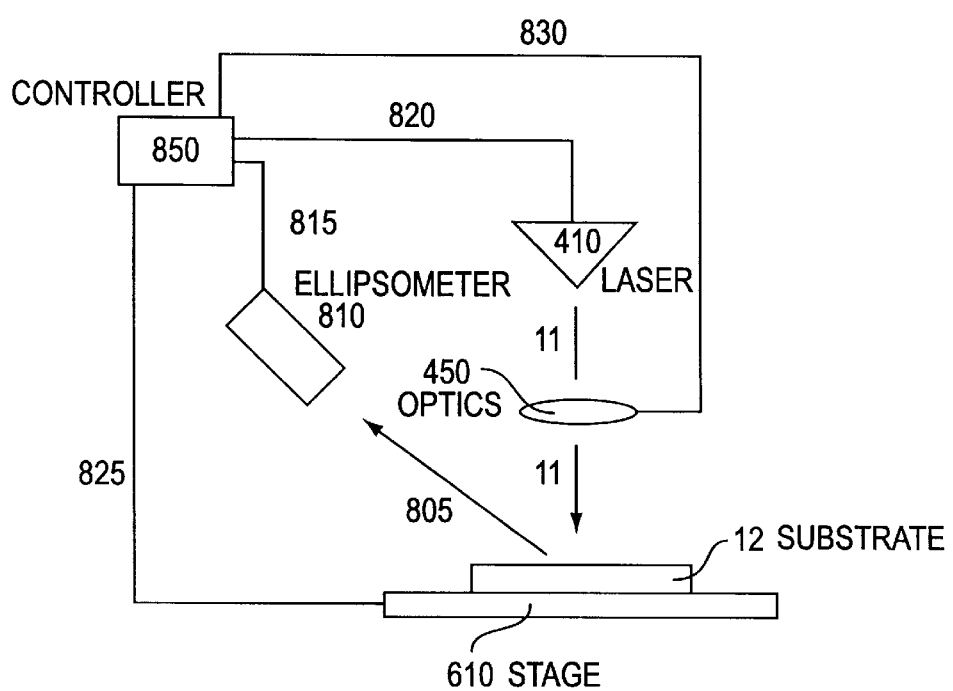
FIG. 6 is a schematic diagram of a first apparatus for use in the process of planarization of the substrate of FIG. 5.

A suitable apparatus is illustrated schematically in FIG. 6. Substrate 12 is disposed on movable stage 610, and radiation 11 from source 410 is applied via delivery optics 450. Thickness information 805 is collected by ellipsometer 810 (or other suitable thickness measuring device). A controller 850 receives thickness information 185 from ellipsometer 810, and outputs radiation control signal 820 to source 410 and position control signals 825 to stage 610 or signals 830 to steerable optics 450.

c. Oblique Irradiation

Figure 7:
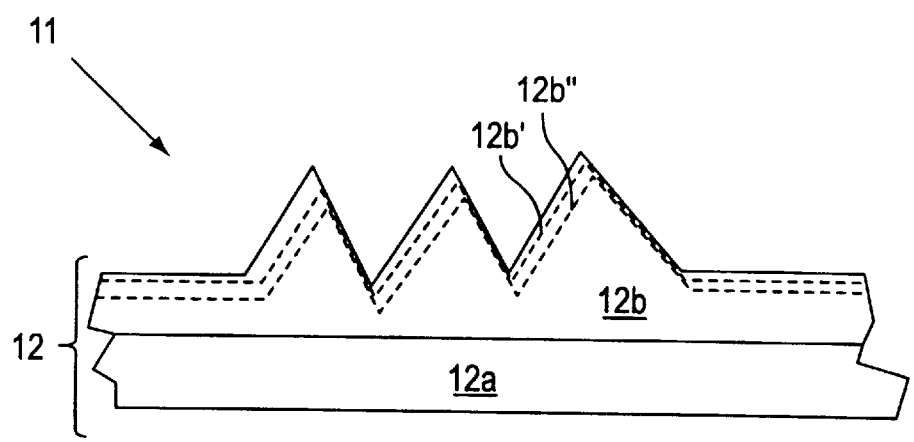
FIG. 7 is a schematic illustration of the selective reduction of the surface roughness of a substrate by irradiating the surface obliquely.

A substrate treatment surface with non-uniform thickness may also be "smoothed" by applying radiation at an oblique angle to the mean substrate surface, as illustrated schematically in FIG. 7. The rough surface layer 12b of substrate 12 (shown in cross-section in FIG. 7) has surface elements oriented in many directions (or at many angles relative to the overall plane of the treatment surface). Since the incident energy and power fluxes from radiation 11 varies with the sine of the incident angle on the surface element, the elements that are most normal to the radiation will be exposed to higher fluxes than elements that are oblique. Further, elements that are shadowed (not exposed) will receive no flux. Thus, the cumulative effect of application of radiation 11 will be to remove relatively more material from normally-oriented surface elements, and less from oblique or shadowed elements (indicated schematically by successive post-treatment surface contours 12b', 12b''). This in turn will reduce the average roughness of the surface layer 12b.

7. Effects of Polarization on Removal

As discussed above, effective removal of undesired material from the surface of a substrate is particularly challenging when the substrate includes a thin film coating. Thin film coatings can range from several Angstroms to ten micrometers in thickness. Treatment of such surfaces using the apparatuses and techniques described above at energy and power levels sufficient to remove many undesired materials have been found to damage the some film coatings. On the other hand, energy and power levels low enough not to damage the thin film have been found not to effectively remove some undesired materials. As evidenced by the data presented below, it has now been determined that polarization of the laser light enables removal of several undesired materials from a variety of thin film materials on various substrates at energy and power fluxes insufficient to damage the thin films.

Some types of piezoelectric substances (particularly those that are ferroelectric) have also been found to be difficult to clean with the techniques and apparatus described above. Piezoelectric materials are those which exhibit an interaction between charge distribution on the material and dimensional changes in the material. Thus, external application of an electrical field produces dimensional changes and vice versa. Thermally-induced dimensional changes in piezoelectric materials also produce an electrical field (the "pyroelectric" effect). Some piezoelectric materials are also ferroelectric, in that electric dipoles in the surface spontaneously align to create a strong mutual interaction and, it is believed, a relatively strong interaction with materials on the surface of the ferroelectric material. It has now been found that polarized laser light is effective in removing particles from two important ferroelectric materials, lithium niobate ($LiNbO_3$) and lithium tantalate ($LiTaO_3$). The cleaning effectiveness is further enhanced by the use of argon gas rather than nitrogen.

Figure 8:
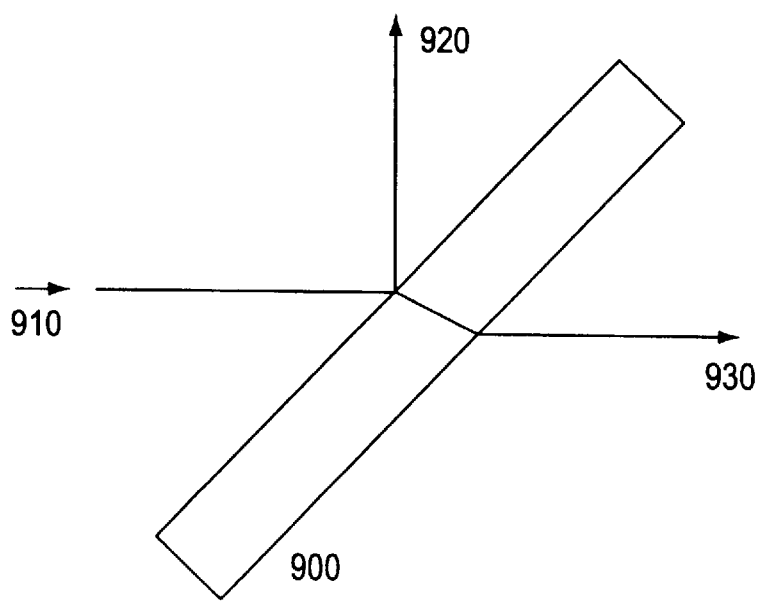
FIG. 8 is a schematic illustration of the operation of a polarizing beam splitter of the type used to conduct tests described herein.

The photon pulse emanating from the laser cavity of the KrF pulsed laser used in these tests is unpolarized, which in the context of a laser means that the light is composed of two orthogonally linearly polarized colinear beams (a p-component and an s-component) whose power randomly (and inversely) varies over time with respect to each other. In the following examples, the laser light applied to the treatment surface was partially polarized by a high energy laser beam splitter, available as part no. 08 BSQ 005, coating suffix/802 from Melles Griot of Irvine, Calif. This beam splitter is formed of UV grade synthetic fused silica, coated on one side for 50% average reflectance at 45° and is antireflection coated on the other side. The beam splitter is illustrated schematically in FIG. 8. The unpolarized incident beam 910 is directed to the first side of the beam splitter 900. The incident beam is split into an reflected beam 920 and a transmitted beam 930. For the 248 nm KrF laser light, the beam splitter reflects 71% of the s-polarized component and 29% of the p-polarized component of the incident beam. Thus, the reflected beam 920 is primarily s-polarized, while the transmitted beam is primarily p-polarized. Each of the reflected and transmitted beams carry approximately 50% of the incident beam's energy and power.

The apparatuses used to generate the data presented below are essentially the same as those illustrated in FIGS. 2A–C except that the beam splitter was substituted for one or more elements in the optical train. Apparatus A (FIG. 2A) was modified by replacing aperture plate 452 and first turning mirror 453 with the beam splitter. Apparatus B (FIG. 2B) was modified by replacing second turning mirror 455 with the beam splitter. Apparatus C (FIG. 2C) was modified by substituting the beam splitter for turning mirror 458. The beam splitter may be disposed in any location in the optical train but is preferably placed close to the laser.

In each example below, a series of treatment "runs" was made on one or more samples of substrate materials. Each run consisted of treating a single swath 612 across the treatment surface, with one or more passes on the swath. Unless otherwise noted, the samples were treated on a planar surface.

For each example below, the test apparatus was calibrated as described above, using measurements of pulse energy at the treatment surface ($E_{ps}$) to develop a correction factor ($R_{correction}$) to apply to the pulse energy shown on the laser's internal meter ($E_{pm}$). Again, $R_{correction}$ is a linear function of the laser input voltage $V_l$ as shown in Equation 5, above. The correction coefficients m and b are indicated in each of the following examples. In general, introduction of the polarizer into the optical train increased optical losses significantly, thus reducing the ratio of $E_{ps}$ to $E_{pm}$.

The effectiveness of the treatment is described in the "comments" column. As discussed above, it is believed that the key process factors are the energy flux per pulse ($F_{eps}$), the power flux per pulse ($F_{pps}$), and the total energy flux ($F_{et}$). These process factors were varied by adjusting the pulse energy ($E_{ps}$), laser pulse repetition rate ($R_l$), stage velocity ($V_s$), and incident region width (w).

A variety of undesired materials are addressed in the following tests. Most of the tests involved one or more of several undesired materials commonly encountered in semiconductor and other industrial fabrication processes. These include: (a) fingerprints (human body oil); (b) human saliva; (c) "haze", which may be composed of one or more of many different materials, but which is generally believed to be a thin, discontinuous coating of very fine particles; (d) "particles", which, unless otherwise specified, are fine fragments of dust and other unknown materials deposited on the surface during exposure to ambient atmospheric conditions; and (e) ink.

a. Indium Tin Oxide on Glass and Quartz

In this example, thin glass and quartz substrates having a thin film of indium tin oxide ($InSnO_x$) were treated. The data in runs 1–7 are for the glass substrate, where fingerprints, environmental particles, and a haze of finely divided particles were removed. In runs 8–11, ink, fingerprints and haze were removed from the quartz substrate. The results are summarized in Table 7a below. The correction coefficients used for these data are m=0.1023, b=2.742.

These data generally show that an indium tin oxide thin film can be effectively cleaned without damaging the film, specifically at an energy flux per pulse ($F_{eps}$) of less than 0.30 J/cm² and power flux per pulse ($F_{pps}$) of less than 8.7 MW/cm². However, at $F_{eps}$=0.31 J/cm² and $F_{pps}$=9.9 MW/cm² the thin film was damaged.

b. Aluminum Film on Silicon

In this example, particles were removed from a thin (thickness of approximately several hundred Angstroms) film of aluminum on digital micromirror devices. Particles that adhere to this aluminum film are disadvantageous because they distort the image projected by the mirrors. The results of the treatment are summarized in Table 7b, below. The correction coefficients used for these data are m=0.0082, b=5.9357.

TABLE 7b

| Run | VI | Epm | Eps | RI | vs | I | w | Feps | Fpps | NpI | Fepa | Npa | Fet | Comments |
|---|---|---|---|---|---|---|---|---|---|---|---|---|---|---|
| 1 | 21 | 504 | 83 | 30 | 5.0 | 8.9 | 1.1 | 0.84 | 24.8 | 7 | 5.6 | 1 | 5.6 | cleaned |
| 2 | 21 | 492 | 81 | 30 | 5.0 | 8.9 | 1.1 | 0.82 | 24.2 | 7 | 5.4 | 1 | 5.4 | cleaned |
| 3 | 21 | 504 | 83 | 30 | 3.0 | 8.9 | 1.1 | 0.84 | 24.8 | 11 | 9.3 | 1 | 9.3 | cleaned |
| 4 | 20 | 503 | 82 | 30 | 7.0 | 8.9 | 1.1 | 0.84 | 24.8 | 5 | 4.0 | 1 | 4.0 | cleaned |
| 5 | 20 | 498 | 82 | 30 | ### | 8.9 | 1.1 | 0.83 | 24.5 | 3 | 2.5 | 1 | 2.5 | cleaned |
| 6 | 21 | 519 | 87 | 30 | 5.0 | 8.9 | 0.7 | 1.39 | 41.0 | 4 | 5.9 | 1 | 5.9 | Damage to substrate |
| 7 | 22 | 540 | 88 | 30 | 5.0 | 8.9 | 0.4 | 2.76 | 81.0 | 2 | 6.0 | 1 | 6.0 | cleaned |
| 8 | 22 | 545 | 89 | 30 | 5.0 | 8.9 | 0.4 | 2.78 | 81.8 | 2 | 6.0 | 1 | 6.0 | cleaned |

In runs 1–5, the digital micromirror devices were treated with polarized laser energy and the particles were effectively removed without damage to the devices.

In run 6 the film was damaged when the beam splitter was replaced with a 50% beam splitter (non-polarizer) available as part no. 248-P50-45-2D-AR from Acton Research of Acton, Mass. This beam splitter has 45 degree coating and at a wavelength of 248 nm (the wavelength of the laser employed in this example) the energy of the incident beam is divided into 50% transmission and 50% reflection. The correction coefficients used for this run are m=0.00794, b=5.813.

Runs 7 and 8 illustrate the effectiveness and similarity of removing particles from both beveled and flat borosilicate glass, respectively.

c. Nickel Coating on a Metal Alloy

In this example, a metal alloy optical stamper having a thin film of nickel was treated. The undesired materials removed were: a) polycarbonate particles; b) environmental particles; c) pieces of latex gloves, which were fused onto TABLE 7a

| Run | VI | Epm | Eps | RI | vs | I | w | Feps | Fpps | NpI | Fepa | Npa | Fet | Comments |
|---|---|---|---|---|---|---|---|---|---|---|---|---|---|---|
| Substrate: Thin glass | | | | | | | | | | | | | | |
| 1 | 17 | 264 | 59 | 30 | 3.0 | 10 | 3.6 | 0.16 | 4.8 | 36 | 5.9 | 1 | 5.9 | cleaned |
| 2 | 17 | 300 | 66 | 30 | 3.0 | 10 | 3.6 | 0.18 | 5.4 | 36 | 6.6 | 1 | 6.6 | cleaned |
| 3 | 18 | 351 | 77 | 30 | 3.0 | 10 | 3.6 | 0.21 | 6.3 | 36 | 7.7 | 1 | 7.7 | cleaned |
| 4 | 18 | 409 | 88 | 30 | 3.0 | 10 | 3.6 | 0.25 | 7.2 | 36 | 8.8 | 1 | 8.8 | cleaned |
| 5 | 19 | 451 | 96 | 30 | 3.0 | 10 | 3.6 | 0.27 | 7.9 | 36 | 9.6 | 1 | 9.6 | cleaned |
| 6 | 20 | 511 | 107 | 30 | 3.0 | 10 | 3.6 | 0.30 | 8.7 | 36 | 10.7 | 1 | 10.7 | cleaned |
| 7 | 21 | 543 | 112 | 30 | 3.0 | 10 | 3.6 | 0.31 | 9.1 | 36 | 11.2 | 1 | 11.2 | Damage to substrate |
| Substrate: Quartz | | | | | | | | | | | | | | |
| 8 | 17 | 261 | 58 | 30 | 5.0 | 10 | 3.6 | 0.16 | 4.7 | 22 | 3.5 | 1 | 3.5 | cleaned |
| 9 | 18 | 306 | 67 | 30 | 5.0 | 10 | 3.6 | 0.19 | 5.5 | 22 | 4.0 | 1 | 4.0 | cleaned |
| 10 | 18 | 354 | 77 | 30 | 5.0 | 10 | 3.6 | 0.21 | 6.3 | 22 | 4.6 | 1 | 4.6 | cleaned |
| 11 | 19 | 372 | 80 | 30 | 3.0 | 10 | 3.6 | 0.22 | 6.6 | 36 | 8.0 | 1 | 8.0 | cleaned | the nickel surface using heat and pressure; d) glycol residue; and e) machine lubricating oil. The results are summarized in Table 7c, below. The correction coefficients used for these data are m=0.1052, b=4.7874.

d. Chrome Thin Film on Quarts

In this example, runs were made using a quartz substrate having an 800 Å thick chrome layer. The chrome layer had three surface geometries: (a) a generally planar, unpatterned TABLE 7c

| Run | VI | Epm | Eps | RI | vs | I | w | Feps | Fpps | NpI | Fepa | Npa | Fet | Comments |
|---|---|---|---|---|---|---|---|---|---|---|---|---|---|---|
| Contaminant: Polycarbonate | | | | | | | | | | | | | | |
| 1 | 20 | 495 | 72 | 30 | 8.0 | 25 | 1.8 | 0.16 | 4.7 | 7 | 1.1 | 2 | 2.2 | Residual |
| 2 | 20 | 550 | 80 | 30 | 8.0 | 25 | 1.8 | 0.18 | 5.2 | 7 | 1.2 | 2 | 2.4 | |
| 3 | 20 | 550 | 80 | 30 | 8.0 | 25 | 1.8 | 0.18 | 5.2 | 7 | 1.2 | 3 | 3.6 | |
| 4 | 19 | 545 | 80 | 30 | 8.0 | 25 | 1.8 | 0.18 | 5.2 | 7 | 1.2 | 10 | 12 | Significant reduction. |
| 5 | 19 | 550 | 81 | 30 | 8.0 | 25 | 1.8 | 0.18 | 5.3 | 7 | 1.2 | 15 | 18 | Further reduction |
| 6 | 19 | 550 | 81 | 30 | 8.0 | 25 | 1.8 | 0.18 | 5.3 | 7 | 1.2 | 20 | 24 | Further reduction |
| Contaminant: particles | | | | | | | | | | | | | | |
| 7 | 19 | 550 | 81 | 30 | 8.0 | 25 | 1.8 | 0.18 | 5.3 | 7 | 1.2 | 1 | 1.2 | excellent removal efficiency. |
| 8 | 19 | 550 | 81 | 30 | 8.0 | 25 | 1.8 | 0.18 | 5.3 | 7 | 1.2 | 3 | 3.6 | |
| 9 | 19 | 550 | 81 | 30 | 8.0 | 25 | 1.8 | 0.18 | 5.3 | 7 | 1.2 | 5 | 6.1 | |
| 10 | 19 | 550 | 81 | 30 | 8.0 | 25 | 1.8 | 0.18 | 5.3 | 7 | 1.2 | 4 | 4.9 | |
| Contaminant: latex gloves | | | | | | | | | | | | | | |
| 11 | 17 | 400 | 60 | 30 | 8.0 | 25 | 1.8 | 0.13 | 4.0 | 7 | 0.9 | 1 | 0.9 | residual |
| 12 | 17 | 400 | 60 | 30 | 8.0 | 25 | 1.8 | 0.13 | 4.0 | 7 | 0.9 | 1 | 0.9 | no effect on residual removal. |
| 13 | 19 | 500 | 74 | 30 | 8.0 | 25 | 1.8 | 0.16 | 4.8 | 7 | 1.1 | 1 | 1.1 | residual reduction |
| 14 | 21 | 600 | 86 | 30 | 8.0 | 25 | 1.8 | 0.19 | 5.6 | 7 | 1.3 | 1 | 1.3 | residual break down, removal |
| 15 | 19 | 500 | 74 | 30 | 8.0 | 25 | 1.8 | 0.16 | 4.8 | 7 | 1.1 | 1 | 1.1 | |
| 16 | 19 | 500 | 74 | 30 | 5.0 | 25 | 1.8 | 0.16 | 4.8 | 11 | 1.8 | 1 | 1.8 | some removal |
| 17 | 20 | 500 | 73 | 30 | 5.0 | 25 | 1.8 | 0.16 | 4.8 | 11 | 1.8 | 2 | 3.5 | significant removal |
| 18 | 20 | 500 | 73 | 30 | 5.0 | 25 | 1.8 | 0.16 | 4.8 | 11 | 1.7 | 4 | 7.0 | cleaned |
| Contaminant: oil | | | | | | | | | | | | | | |
| 19 | 18 | 400 | 60 | 30 | 8.0 | 25 | 1.8 | 0.13 | 3.9 | 7 | 0.9 | 1 | 0.9 | brownish residual |
| 20 | 18 | 400 | 60 | 30 | ### | 25 | 1.8 | 0.13 | 3.9 | 5 | 0.7 | 2 | 1.4 | little brownish residual |
| 21 | 18 | 400 | 60 | 30 | ### | 25 | 1.8 | 0.13 | 3.9 | 5 | 0.7 | 2 | 1.4 | complete removal |
| Contaminant: glycol | | | | | | | | | | | | | | |
| 22 | 18 | 400 | 59 | 30 | ### | 25 | 1.8 | 0.13 | 3.9 | 5 | 0.7 | 1 | 0.7 | additional pass required |
| 23 | 19 | 400 | 59 | 30 | 8.0 | 25 | 1.8 | 0.13 | 3.9 | 7 | 0.9 | 1 | 0.9 | complete removal |
| 24 | 19 | 400 | 59 | 30 | 8.0 | 25 | 1.8 | 0.13 | 3.9 | 7 | 0.9 | 1 | 0.9 | complete removal |
| Damage | | | | | | | | | | | | | | |
| 25 | 19 | 500 | 73 | 30 | 5.0 | 25 | 1.1 | 0.27 | 7.8 | 7 | 1.8 | 1 | 1.8 | damage to surface - "bubbles". |

The polycarbonate and particles were removed using multiple passes at $F_{eps}$=0.18 J/cm$^2$ and $F_{pps}$=5.3 MW/cm$^2$. Both wet and dry latex glove material was removed at $F_{eps}$=0.16 J/cm$^2$ and $F_{pps}$=4.8 MW/cm$^2$. The wet latex glove material caused some localized corrosion. Glycol was removed in a single pass and the removal of oil required two passes at $F_{eps}$=0.13 J/cm$^2$ and $F_{pps}$=3.9 MW/cm$^2$. The nickel coating was damaged at $F_{eps}$=0.27 J/cm$^2$ and $F_{pps}$=7.8 MW/cm$^2$ as bubbles were observed on the surface.

surface; (b) a surface patterned for a logic mask; and (c) a surface patterned for a DRAM mask. Environmental particles were removed in runs 1–10 and 17–23. In runs 11–16 photoresist residual was the contaminant. Runs 17–20 were performed to determine the damage threshold. The results are illustrated in Table 7d, below. The correction coefficients used for these data are m=0.1888, b=5.5861.

TABLE 7d

| Run | VI | Epm | Eps | RI | vs | I | w | Feps | Fpps | NpI | Fepa | Npa | Fet | Comments |
|---|---|---|---|---|---|---|---|---|---|---|---|---|---|---|
| Substrate: Unpatterned | | | | | Contaminant Particles | | | | | | | | | |
| 1 | 19 | 504 | 55 | 30 | 5.0 | 27 | 5.0 | 0.04 | 1.2 | 30 | 1.2 | 1 | 1.2 | little removal |
| 2 | 19 | 510 | 55 | 30 | 3.0 | 27 | 5.0 | 0.04 | 1.2 | 50 | 2.1 | 1 | 2.1 | no removal |
| 3 | 21 | 597 | 63 | 30 | 3.0 | 27 | 5.0 | 0.05 | 1.4 | 50 | 2.3 | 1 | 2.3 | little removal |
| 4 | 21 | 597 | 63 | 30 | 3.0 | 27 | 4.0 | 0.06 | 1.7 | 40 | 2.3 | 1 | 2.3 | good removal |
| 5 | 21 | 590 | 62 | 30 | 3.0 | 27 | 4.0 | 0.06 | 1.7 | 40 | 2.3 | 1 | 2.3 | remove particles, some haze |
| 6 | 22 | 656 | 67 | 30 | 3.0 | 27 | 4.0 | 0.06 | 1.8 | 40 | 2.5 | 1 | 2.5 | no apparent particle removal |
| 7 | 22 | 653 | 67 | 30 | 3.0 | 27 | 4.0 | 0.06 | 1.8 | 40 | 2.5 | 1 | 2.5 | good removal, some cracks in Cr |
| 8 | 22 | 657 | 67 | 30 | 3.0 | 27 | 4.0 | 0.06 | 1.8 | 40 | 2.5 | 1 | 2.5 | good removal |
| 9 | 22 | 657 | 67 | 30 | 5.0 | 27 | 4.0 | 0.06 | 1.8 | 24 | 1.5 | 1 | 1.5 | good removal |
| 10 | 22 | 657 | 67 | 30 | 3.0 | 27 | 4.0 | 0.06 | 1.8 | 40 | 2.5 | 2 | 5.0 | good removal, no change 2nd pass |

TABLE 7d-continued

| Run | VI | Epm | Eps | RI | vs | I | w | Feps | Fpps | NpI | Fepa | Npa | Fet | Comments |
|---|---|---|---|---|---|---|---|---|---|---|---|---|---|---|
| Substrate: Unpatterned | | | | Contaminant: Photoresist residual | | | | | | | | | | |
| 11 | 20 | 650 | 69 | 30 | 3.0 | 27 | 3.8 | 0.07 | 2.0 | 38 | 2.6 | 2 | 5.1 | no effect |
| 12 | 22 | 656 | 67 | 30 | 3.0 | 27 | 3.8 | 0.07 | 2.0 | 38 | 2.5 | 5 | 12.5 | no effect |
| 13 | 22 | 669 | 69 | 30 | 1.5 | 27 | 3.8 | 0.07 | 2.0 | 75 | 5.1 | 2 | 10.2 | removal |
| 14 | 22 | 668 | 69 | 30 | 1.5 | 27 | 3.8 | 0.07 | 2.0 | 75 | 5.1 | 2 | 10.2 | removal |
| 15 | 19 | 518 | 56 | 30 | 1.0 | 27 | 3.8 | 0.06 | 1.6 | 113 | 6.3 | 2 | 12.5 | removal, but some damage |
| 16 | 18 | 435 | 48 | 30 | 1.0 | 27 | 3.8 | 0.05 | 1.4 | 113 | 5.4 | 2 | 10.8 | removal, but some damage |
| strate: Logic Mask Patterned | | | | Contaminant: Particles | | | | | | | | | | |
| 17 | 22 | 656 | 67 | 30 | 3.0 | 27 | 3.8 | 0.07 | 2.0 | 38 | 2.5 | 1 | 2.5 | some damage |
| 18 | 20 | 563 | 60 | 30 | 3.0 | 27 | 3.8 | 0.06 | 1.7 | 38 | 2.2 | 1 | 2.2 | no damage |
| 19 | 18 | 408 | 45 | 30 | 3.0 | 27 | 3.8 | 0.04 | 1.3 | 38 | 1.7 | 1 | 1.7 | no damage |
| 20 | 21 | 623 | 65 | 30 | 3.0 | 27 | 3.8 | 0.06 | 1.9 | 38 | 2.4 | 1 | 2.4 | no damage |
| strate: DRAM Mask Patterned | | | | Contaminant Particles | | | | | | | | | | |
| 21 | 22 | 653 | 67 | 30 | 3.0 | 27 | 3.8 | 0.07 | 1.9 | 38 | 2.5 | 1 | 2.5 | removal |
| 22 | 20 | 560 | 60 | 30 | 3.0 | 27 | 3.8 | 0.06 | 1.7 | 38 | 2.2 | 1 | 2.2 | removal |
| 23 | 18 | 427 | 48 | 30 | 3.0 | 27 | 3.8 | 0.05 | 1.4 | 38 | 1.8 | 1 | 1.8 | no removal |

Particles were effectively removed from the unpatterned, chrome film without damage at $F_{eps}=0.06$ J/cm$^2$ and $F_{pps}=1.8$ MW/cm$^2$. Under stable energy and power fluxes, photoresist residual removal from unpatterned, chrome film was dependent upon the average energy flux per pass, $F_{epa}$. At $F_{epa}=2.5$ J/cm$^2$, no removal occurred even after multiple passes. Two passes effectively removed the photoresist residual at $F_{epa}=5.1$ J/cm$^2$, however, at $F_{epa}$ values of 5.4 and 6.3 J/cm$^2$ the chrome coating began cracking.

For runs involving the patterned logic mask, the data suggest that the upper operational limit is at $F_{eps}=0.07$ J/cm$^2$, $F_{epa}=2.5$ J/cm$^2$, and $F_{pps}=2.0$ MW/cm$^2$ because under these conditions some damage occurred.

Particles were not removed from the patterned, DRAM mask at $F_{eps}=0.05$ J/cm$^2$, $F_{epa}=1.8$ J/cm$^2$, and $F_{pps}=1.4$ MW/cm$^2$. At higher energy and power fluxes, effective removal was observed.

e. Hafnium Oxide on Optics

In this example, a different adjustable focusing lens 457 was employed. This lens is 50 mm×50 mm with a focal length of 200 mm and is available as part no. 03-060-1-248-AR from Acton Research of Acton, Mass. In the following runs, contaminants were removed from a 20 Å thick hafnium oxide coating on quartz and on BK-7 (an industry-standard composition of borosilicate crown glass). The results are summarized in Table 7e, below. The substrates treated were: a) an optical reflector (BK-7); b) a Porro mirror (quartz); c) a Dove prism (BK-7); a laser reflector (BK-7); and e) and an output coupler (BK-7). The undesired materials treated were: a) fingerprints; b) saliva; c) adhesive; d) and stain. Only environmental particles were present on the substrate where the contaminant is identified as either "clean" or "set-up". The correction coefficients used for these data are m=0.0436, b=2.7844.

TABLE 7e

| Run | VI | Epm | Eps | RI | vs | I | w | Feps | Fpps | NpI | Fepa | Npa | Fet | Comments |
|---|---|---|---|---|---|---|---|---|---|---|---|---|---|---|
| Optical Reflector; Runs 1 & 2 = Fingerprint; Run 3 = Saliva; Runs 4 & 5 = Adhesive | | | | | | | | | | | | | | |
| 1 | 22 | 570 | 152 | 30 | 0.3 | 25 | 0.6 | 0.97 | 28.4 | 76 | 73 | 1 | 73 | Fingerprint removed |
| 2 | 22 | 560 | 150 | 30 | 0.3 | 25 | 0.6 | 0.95 | 27.9 | 76 | 72 | 1 | 72 | Fingerprint removed |
| 3 | 22 | 570 | 152 | 30 | 0.3 | 25 | 0.6 | 0.97 | 28.4 | 76 | 73 | 1 | 73 | Removal, Saliva damaged film |
| 4 | 22 | 570 | 152 | 30 | 0.3 | 25 | 0.6 | 0.97 | 28.4 | 76 | 73 | 2 | 146 | No gas flow, no removal |
| 5 | 22 | 570 | 152 | 30 | 0.3 | 25 | 0.6 | 0.97 | 28.4 | 76 | 73 | 1 | 73 | Adhesive removed |
| Porro Mirror; Run 1 = Adhesive; Run 2 = Saliva; Run 3 = Particles | | | | | | | | | | | | | | |
| 1 | 18 | 300 | 84 | 30 | 0.3 | 25 | 0.9 | 0.37 | 10.9 | 109 | 40 | 1 | 40 | Gas flow dependency. |
| 2 | 19 | 400 | 110 | 30 | 1.5 | 25 | 0.9 | 0.48 | 14.2 | 18 | 8.8 | 1 | 9 | Saliva stains removed. |
| 3 | 19 | 400 | 110 | 30 | 5.0 | 25 | 1.3 | 0.34 | 10.0 | 8 | 2.6 | 4 | 11 | Removal, no damage |
| 3 | 20 | 500 | 137 | 30 | 5.0 | 25 | 1.3 | 0.42 | 12.5 | 8 | 3.3 | 3 | 10 | Removal, no damage |
| 3 | 22 | 565 | 151 | 30 | 5.0 | 25 | 1.3 | 0.47 | 13.8 | 8 | 3.6 | 2 | 7 | Damage to film on second pass |
| Dove Prism; Run 1 = Set-up; Run 2 = Fingerprint; Run 4 = Adhesive | | | | | | | | | | | | | | |
| 1 | 19 | 400 | 111 | 30 | 0.8 | 25 | 1.3 | 0.34 | 10.1 | 52 | 18 | 1 | 18 | Particles removed; no damage |
| 2 | 19 | 400 | 111 | 30 | 0.8 | 25 | 1.3 | 0.34 | 10.1 | 52 | 18 | 1 | 18 | No cleaning effect |
| 2 | 22 | 600 | 160 | 30 | 0.4 | 25 | 1.3 | 0.50 | 14.6 | 97 | 48 | 1 | 48 | Surface cleaned. |
| 4 | 22 | 600 | 160 | 30 | 0.4 | 25 | 1.3 | 0.50 | 14.6 | 97 | 48 | 1 | 48 | Adhesive removed. |
| Laser Reflector; Runs 1 & 2 = Fingerprint; Run 3 = Stains | | | | | | | | | | | | | | |
| 1 | 20 | 498 | 136 | 30 | 0.8 | 25 | 1.6 | 0.34 | 10.0 | 64 | 22 | 1 | 22 | Fingerprint removed. |
| 2 | 20 | 500 | 137 | 30 | 1.0 | 25 | 1.6 | 0.34 | 10.0 | 48 | 16 | 1 | 16 | Fingerprint removed |
| 3 | 20 | 500 | 137 | 30 | 1.8 | 25 | 1.7 | 0.32 | 9.5 | 28 | 9.1 | 1 | 9.1 | Stains removed. |

TABLE 7e-continued

| Run | VI | Epm | Eps | RI | vs | I | w | Feps | Fpps | NpI | Fepa | Npa | Fet | Comments |
|---|---|---|---|---|---|---|---|---|---|---|---|---|---|---|
| Output Coupler; Run 1 = Set-up; Runs 1c & 2 = Fingerprint; Run 3 = Saliva |||||||||||||||
| 1 | 19 | 400 | 111 | 30 | 5.0 | 25 | 2.1 | 0.21 | 6.2 | 13 | 2.7 | 1 | 2.7 | Particles removed. |
| 1c | 23 | 590 | 157 | 30 | 0.8 | 25 | 1.1 | 0.60 | 17.6 | 42 | 25 | 1 | 25 | Fingerprint removed |
| 2 | 23 | 590 | 157 | 30 | 0.8 | 25 | 1.1 | 0.60 | 17.6 | 42 | 25 | 1 | 25 | No gas flow, surface damage |
| 3 | 23 | 590 | 157 | 30 | 0.8 | 25 | 1.1 | 0.60 | 17.6 | 42 | 25 | 1 | 25 | Removal, saliva damage |

Fingerprints, saliva, and adhesive were removed from the optical reflector (BK-7) without damage to the hafnium oxide film. Runs 4 and 5 again indicate the significance of the flowing gas, in that no removal was achieved without flowing gas in run 4, while complete removal was achieved in run 5 with gas flow and the same power and energy fluxes and lower total energy.

The treatment surface of the porro mirror was recessed relative to its mounting. In run 1 the adhesive was observed to detach and re-adhere to the treatment surface. In subsequent runs the gas nozzle was reoriented to impinge the flow on the surface (rather than flowing parallel to the surface) and the flow rate increased to more effectively entrain the removed contaminants. Adhesive and saliva were removed from a porro mirror (quartz) and damage occurred where $F_{eps}=0.47$ J/cm$^2$ and $F_{pps}=13.8$ MW/cm$^2$.

Particles were removed from a dove prism (BK-7) without film damage at $F_{eps}=0.34$ J/cm$^2$ and $F_{pps}=10.1$ MW/cm$^2$. Removal of fingerprints and adhesive required higher energy and power flux levels (per pulse) of 0.50 and 14.6, J/cm$^2$ respectively. Fingerprints, particles, stains and saliva were removed from the laser reflector (BK-7) and the output coupler (BK-7).

Several surfaces were damaged during saliva removal. It is believed that corrosion occurred due to the acidic nature of saliva.

f. Piezoelectric Substrates

In this example, environmental particles were removed from three piezoelectric materials: lithium niobate (LiNbO$_3$); lithium tantalate (LiTaO$_3$); and quartz. Initially, unpolarized light was employed and was ineffective in removing particles. Next, the beam splitter was disposed in the optical train so that the reflected beam 920 was applied to the surface, as was done in all of the previous "polarization" examples (7a–e). This was also found to be ineffective. The optical train was then reconfigured to dispose the beam splitter so that the transmitted beam 930 was applied to the treatment surface. This was accomplished by placing the beam splitter between turning mirrors 455 and 456 in FIG. 2B such that the laser light reflected from turning mirror 455 was transmitted through the beam splitter to turning mirror 456. The same result, polarization in transmission, may be accomplished using the apparatuses schematically illustrated in FIGS. 2A and 2C by placing the beam splitter between turning mirror 455 and turning mirror 456. The transmitted, polarized light produced superior results.

The substrates employed are LiNbO$_3$ (runs 1–10), LiTaO$_3$ (runs 11–16), and quartz (runs 17–23). In the run number, the letter N designates the use of nitrogen as the carrier gas and A designates argon. Thus, 11N identifies an experimental run using nitrogen and LiTaO$_3$ and run 19A represents a run that employed argon gas across a quartz substrate. The results are summarized in Table 7f, below. The correction coefficients used for these data are m=0.1701, b=4.4228.

TABLE 7f

| Run | VI | Epm | Eps | RI | va | I | w | Feps | Fpps | NpI | Fepa | Npa | Fet | Comments |
|---|---|---|---|---|---|---|---|---|---|---|---|---|---|---|
| LiNbO3 |||||||||||||||
| 1N | 19 | 500 | 65 | 30 | 8.0 | 25 | 2.5 | 0.10 | 3.0 | 9 | 1.0 | 1 | 1.0 | Surface Damage |
| 2N | 17 | 350 | 47 | 30 | 8.0 | 25 | 3.7 | 0.05 | 1.5 | 14 | 0.7 | 1 | 0.7 | Surface Damage |
| 3N | 20 | 520 | 67 | 30 | 8.0 | 25 | 6.4 | 0.04 | 1.2 | 24 | 1.0 | 1 | 1.0 | Poor removal |
| 4N | 21 | 600 | 75 | 30 | 8.0 | 25 | 6.4 | 0.05 | 1.4 | 24 | 1.1 | 1 | 1.1 | Particle removal |
| 5A | 18 | 400 | 53 | 30 | 8.0 | 25 | 6.3 | 0.03 | 1.0 | 24 | 0.8 | 1 | 0.8 | Effective removal |
| 6A | 19 | 500 | 66 | 30 | 8.0 | 25 | 6.3 | 0.04 | 1.2 | 24 | 1.0 | 1 | 1.0 | Effective removal |
| 7A | 20 | 600 | 77 | 30 | 8.0 | 25 | 6.3 | 0.05 | 1.4 | 24 | 1.1 | 1 | 1.1 | Effective removal |
| 8A | 23 | 705 | 85 | 30 | 8.0 | 25 | 6.3 | 0.05 | 1.6 | 24 | 1.3 | 1 | 1.3 | Effective removal |
| 9A | 18 | 400 | 53 | 30 | 8.0 | 25 | 6.3 | 0.03 | 1.0 | 24 | 0.8 | 1 | 0.8 | Effective removal |
| 10A | 19 | 450 | 59 | 30 | 8.0 | 25 | 2.5 | 0.09 | 2.8 | 9 | 0.9 | 1 | 0.9 | Damage |
| LiTaO3 |||||||||||||||
| 11N | 18 | 350 | 47 | 30 | 8.0 | 25 | 2.5 | 0.08 | 2.2 | 9 | 0.7 | 1 | 0.7 | Particle removal |
| 12A | 18 | 400 | 54 | 30 | 8.0 | 25 | 6.3 | 0.03 | 1.0 | 24 | 0.8 | 1 | 0.8 | Effective removal |
| 13A | 19 | 500 | 66 | 30 | 8.0 | 25 | 6.3 | 0.04 | 1.2 | 24 | 1.0 | 1 | 1.0 | Effective removal |
| 14A | 20 | 600 | 77 | 30 | 8.0 | 25 | 6.3 | 0.05 | 1.4 | 24 | 1.1 | 1 | 1.1 | Effective removal |
| 15A | 22 | 687 | 84 | 30 | 8.0 | 25 | 6.3 | 0.05 | 1.6 | 24 | 1.3 | 1 | 1.3 | Effective removal |
| 16A | 18 | 400 | 54 | 30 | 8.0 | 25 | 3.7 | 0.06 | 1.7 | 14 | 0.8 | 1 | 0.8 | Damage |
| Quartz |||||||||||||||
| 17N | 19 | 500 | 65 | 30 | 8.0 | 25 | 2.5 | 0.10 | 3.0 | 9 | 1.0 | 1 | 1.0 | Particle removal |

TABLE 7f-continued

| Run | VI | Epm | Eps | RI | va | I | w | Feps | Fpps | NpI | Fepa | Npa | Fet | Comments |
|---|---|---|---|---|---|---|---|---|---|---|---|---|---|---|
| 18N | 21 | 600 | 75 | 30 | 8.0 | 25 | 2.5 | 0.12 | 3.5 | 9 | 1.1 | 1 | 1.1 | Particle removal |
| 19A | 18 | 450 | 60 | 30 | 8.0 | 25 | 1.5 | 0.16 | 4.7 | 6 | 0.9 | 1 | 0.9 | Particle removal |
| 20A | 19 | 500 | 66 | 30 | 8.0 | 25 | 1.5 | 0.18 | 5.2 | 6 | 1.0 | 1 | 1.0 | Particle removal |
| 21A | 19 | 550 | 72 | 30 | 8.0 | 25 | 1.5 | 0.19 | 5.6 | 6 | 1.1 | 1 | 1.0 | Particle removal |
| 22A | 20 | 600 | 77 | 30 | 8.0 | 25 | 1.5 | 0.20 | 6.0 | 6 | 1.2 | 1 | 1.2 | Particle removal |
| 23A | 23 | 711 | 86 | 30 | 8.0 | 25 | 1.5 | 0.23 | 6.8 | 6 | 1.3 | 1 | 1.3 | Particle removal |

For $LiNbO_3$, particle removal was more effective when using argon gas than when using nitrogen. This improved removal even occurred at lower energy and power fluxes (per pulse). The $LiNbO_3$ substrate was damaged at higher flux rates, $F_{eps}$ 0.09 $J/cm^2$ and $F_{pps}$=2.8 $MW/cm^2$. The average energy flux per pass ($F_{epa}$) appears to be unrelated to removal effectiveness and surface damage.

The results are similar for $LiTaO_3$ as removal was effective at lower fluxes using argon as compared to nitrogen. The surface treated in run 16A was cracked before treatment. Particles were effectively removed from this surface until the laser light encountered the crack—the substrate then shattered.

The data do not suggest any relationship between removal effectiveness and the type of carrier gas for the quartz substrate.

The selection of the carrier gas is more significant with the ferroelectric substrates. It is believed that argon gas may be more effective than nitrogen in sweeping particles away from the tested substrates because argon is a noble gas which is less reactive with these substrates than is nitrogen.

8. Back Side Cleaning

A variety of substrates were treated by irradiating the side of the substrate opposite to the side bearing the undesired material. In this orientation of the substrate with respect to the incident radiation, the undesired material is considered to be on the "back" side of the substrate. The tests described above are considered to be "front side" cleaning because the undesired material was removed from the side of the substrate irradiated.

The apparatuses used to conduct the tests described below are essentially the same as those illustrated in FIGS. 2A–C, except that the treatment sample is oriented so that the surface from which the undesired material is to be removed faces down. (The sample is held in position above the stage by an adjustable holder.) The radiation is thus applied to the "desired material" side, or the contaminant-free side of the substrate. The gas delivery system was also reoriented to flow gas across the lower side of the substrate (except as noted below) and the video camera reoriented to observe the front side.

a. Removal of Polycrystalline Silicon from Quartz

In this example, a quartz furnace tube was treated to remove a layer of polycrystalline silicon. The test specimen was essentially the same as that described in Example 5, above, and the irradiation incident region and application technique was the same as Example 5 except that the sample was radiated from the back side. The data are presented in Table 8a, below: The correction coefficients used for these data are m=0.029, b=1.20.

TABLE 8a

| Run | VI | Epm | Eps | RI | vs | I | w | Feps | Fpps | NpI | Fepa | Npa | Fet | Comments | Rc |
|---|---|---|---|---|---|---|---|---|---|---|---|---|---|---|---|
| 17a | 18 | 300 | 174 | 30 | 5 | 15 | 0.24 | 4.84 | 142 | 1.4 | 6.96 | 1 | 6.96 | no effect | 6 |
| 17b | 20 | 400 | 225 | 30 | 5 | 15 | 0.24 | 6.26 | 184 | 1.4 | 9.01 | 1 | 9.01 | no effect | 6 |
| 17c | 21 | 450 | 248 | 30 | 5 | 15 | 0.24 | 6.88 | 202 | 1.4 | 9.90 | 1 | 9.90 | no effect | 6 |
| 17d | 23 | 500 | 268 | 30 | 5 | 15 | 0.24 | 7.45 | 219 | 1.4 | 10.73 | 1 | 10.73 | removal | 1 |
| 18 | 23 | 500 | 268 | 30 | 5 | 15 | 0.24 | 7.45 | 219 | 1.4 | 10.73 | 1 | 10.73 | removal | 1 |
| 19 | 20 | 399 | 225 | 30 | 5 | 15 | 0.24 | 6.24 | 184 | 1.4 | 8.99 | 1 | 8.99 | removal | 1 |
| 20 | 20 | 400 | 224 | 30 | 20 | 15 | 0.24 | 6.22 | 183 | 0.4 | 2.24 | 1 | 2.24 | removal | 1 |

The data indicate that polycrystalline silicon can be removed from a quartz substrate by applying the radiation from the back side of the substrate. It was observed that the silicon was released in relatively large flakes, so that the entire thickness of the silicon over a given area of the substrate came away in a single event, rather than by gradual removal as seen in Example 5 above for front side application of radiation.

b. Removal of Manganese Ions from Quartz

In this example, a quartz substrate coated with manganese ions from the residue of a dried manganese standard solution (1000 ppm $Mn^{++}$) was treated by irradiation from the front side (runs 1–3, ions proximate to the laser beam), the back side (runs 5–7, ions distal to the laser beam) and sequentially from both sides (run 4). In these tests, the gas was flowed across the surface having the manganese ions. The results are shown in Table 8b1, below. The correction coefficients used for these data are m=0.0698, b=2.7757.

TABLE 8b1

| Run | Vl | Epm | Eps | Rl | vs | I | w | Feps | Fpps | NpI | Fepa | Npa | Fet | Comments |
|---|---|---|---|---|---|---|---|---|---|---|---|---|---|---|
| 1 | 19 | 525 | 128 | 30 | 5.0 | 26 | 0.7 | 0.70 | 20.7 | 4 | 3.0 | 2 | 5.9 | Front side, some damage |
| 2 | 21 | 653 | 154 | 30 | 3.0 | 26 | 0.7 | 0.85 | 24.9 | 7 | 5.9 | 1 | 5.9 | Front side, some damage |
| 3 | 20 | 612 | 147 | 30 | 5.0 | 26 | 0.7 | 0.81 | 23.7 | 4 | 3.4 | 1 | 3.4 | Front side, some damage |
| 4 | 20 | 609 | 146 | 30 | 5.0 | 26 | 1.2 | 0.47 | 13.8 | 7 | 3.4 | 2 | 6.7 | pass 1 front/pass 2 back |
| 5 | 21 | 650 | 154 | 30 | 5.0 | 26 | 1.2 | 0.49 | 14.5 | 7 | 3.5 | 1 | 3.5 | Back, cleaned |
| 6 | 21 | 650 | 154 | 30 | 7.0 | 26 | 1.2 | 0.49 | 14.5 | 5 | 2.5 | 1 | 2.5 | Back, cleaned |
| 7 | 22 | 692 | 161 | 30 | 7.0 | 26 | 1.2 | 0.51 | 15.1 | 5 | 2.6 | 1 | 2.6 | Back, cleaned |

In runs 1–4, the treatment was found to produce a by-product or residue on the surface of the substrate that is believed to be indicative of damage. In runs 5–7 no such residue was observed. In fact, in run 4 the residue created in the front side operation was removed in the back side treatment. Furthermore, runs 5–7 resulted in complete ion removal, whereas runs 1–3 provided only partial cleaning.

In the following tests, radiation was applied to the side of the quartz substrate opposite to the side having the undesired material or contaminant (back side treatment). The gas was flowed across the front side in runs 1–4 and across the back side in runs 5–12. The data are shown in Table 8b2, below. The correction coefficients used for these data are m=0.0698, b=2.7757.

TABLE 8b2

| Run | Vl | Epm | Eps | Rl | vs | I | w | Feps | Fpps | NpI | Fepa | Npa | Fet | Comments |
|---|---|---|---|---|---|---|---|---|---|---|---|---|---|---|
| 1 | 20 | 611 | 127 | 30 | 5.0 | 30 | 1.3 | 0.32 | 9.5 | 8 | 2.5 | 1 | 2.5 | partial cleaning, some damage |
| 2 | 20 | 560 | 118 | 30 | 5.0 | 30 | 1.3 | 0.30 | 8.9 | 8 | 2.4 | 1 | 2.4 | partial cleaning, some damage |
| 3 | 20 | 606 | 126 | 30 | 7.0 | 30 | 1.3 | 0.32 | 9.5 | 6 | 1.8 | 1 | 1.8 | partial cleaning, some damage |
| 4 | 22 | 659 | 133 | 30 | 7.0 | 30 | 1.3 | 0.34 | 10.0 | 6 | 1.9 | 1 | 1.9 | partial cleaning, some damage |
| 5 | 22 | 662 | 134 | 30 | 9.0 | 30 | 1.3 | 0.34 | 10.1 | 4 | 1.5 | 1 | 1.5 | cleaned |
| 6 | 22 | 656 | 132 | 30 | 7.0 | 30 | 1.3 | 0.34 | 10.0 | 6 | 1.9 | 1 | 1.9 | cleaned |
| 7 | 22 | 650 | 131 | 30 | 3.0 | 30 | 1.3 | 0.34 | 9.9 | 13 | 4.4 | 1 | 4.4 | cleaned |
| 8 | 22 | 638 | 129 | 30 | 5.0 | 30 | 1.3 | 0.33 | 9.7 | 8 | 2.6 | 1 | 2.6 | cleaned |
| 9 | 22 | 655 | 132 | 30 | 7.0 | 30 | 1.8 | 0.24 | 7.2 | 8 | 1.9 | 1 | 1.9 | cleaned |
| 10 | 22 | 657 | 133 | 30 | 9.0 | 30 | 1.8 | 0.25 | 7.2 | 6 | 1.5 | 1 | 1.5 | cleaned |
| 11 | 22 | 650 | 131 | 30 | 5.0 | 30 | 1.8 | 0.24 | 7.1 | 11 | 2.6 | 1 | 2.6 | cleaned |
| 12 | 22 | 638 | 129 | 30 | 3.0 | 30 | 1.8 | 0.24 | 7.0 | 18 | 4.3 | 1 | 4.3 | cleaned |

These data indicate that the flowing gas should be directed across the surface having the undesired material. A comparison of runs 1–4 and 9–12 demonstrates that effective removal occurs using the back side irradiation technique even when employing substantially reduced energy and flux levels.

c. Removal of Organics from Various Materials

In this example, organic material (black ink) was applied to the "front" surface of samples of various substrate materials. These samples were then treated by irradiation from their back side. The substrates included: a) <100> silicon; b) 304 electropolished stainless steel; c) opaque wafer carrier plastic (reflected the laser light); d) "Canasite," a ceramic material that is a proprietary formulation of calcium, sodium and silicon; e) polytetrafluoroethylene (20 mil thick); f) polypropylene film (from a "freezer" bag); and g) polycarbonate packing tape applied to quartz. The results are summarized in Table 8c, below. The correction coefficients used for these data are m=0.0698, b=2.7757.

TABLE 8c

| Run | Vl | Epm | Eps | Rl | vs | l | w | Feps | Fpps | Npl | Fepa | Npa | Fet | Comments |
|---|---|---|---|---|---|---|---|---|---|---|---|---|---|---|
| Si<100> | | | | | | | | | | | | | | |
| 1 | 22 | 606 | 141 | 30 | 1.0 | 30 | 1.8 | 0.26 | 7.7 | 54 | 14 | 1 | 14.1 | No cleaning |
| 304 EPS | | | | | | | | | | | | | | |
| 2 | 22 | 606 | 141 | 30 | 1.0 | 30 | 1.8 | 0.26 | 7.7 | 54 | 14 | 1 | 14.1 | No cleaning |
| Wafer carrier plastic | | | | | | | | | | | | | | |
| 3 | 22 | 627 | 145 | 30 | 1.0 | 30 | 1.8 | 0.27 | 7.9 | 54 | 15 | 1 | 14.5 | No cleaning, carrier damaged |
| Polytetrafluoroethylene | | | | | | | | | | | | | | |
| 4 | 22 | 627 | 145 | 30 | 1.0 | 30 | 1.8 | 0.27 | 7.9 | 54 | 15 | 1 | 14.5 | Cleaned but damaged surface |
| 5 | 17 | 308 | 78 | 30 | 5.0 | 30 | 3.0 | 0.09 | 2.5 | 18 | 1.6 | 1 | 1.6 | Cleaned, no damage |
| Canasite | | | | | | | | | | | | | | |
| 6 | 17 | 308 | 78 | 30 | 5.0 | 30 | 3.0 | 0.09 | 2.5 | 18 | 1.6 | 1 | 1.6 | No cleaning |

TABLE 8c-continued

| Run | Vl | Epm | Eps | Rl | vs | l | w | Feps | Fpps | Npl | Fepa | Npa | Fet | Comments |
|---|---|---|---|---|---|---|---|---|---|---|---|---|---|---|
| Freezer bag (polypropylene) | | | | | | | | | | | | | | |
| 7 | 22 | 627 | 145 | 30 | 5.0 | 30 | 1.5 | 0.32 | 9.5 | 9 | 2.9 | 1 | 2.9 | Cleaned |
| Clear packing tape on quartz (polycarbonate) | | | | | | | | | | | | | | |
| 8 | 22 | 627 | 145 | 30 | 5.0 | 30 | 0.8 | 0.61 | 17.8 | 5 | 2.9 | 1 | 2.9 | Cleaned |

The ink was not removed from the silicon <100>, stainless steel, wafer carrier plastic, or Canasite, but was effectively removed from the polytetrafluoroethylene, polypropylene and polycarbonate on quartz. The distinction between removal effectiveness appears to be derived from the differences in transparency of the substrate material to the wavelength of the KrF laser light. All of the materials that were not cleaned are essentially opaque to the KrF light, while those that were cleaned are at least somewhat transparent. It is noted that polytetrafluoroethylene weakly transmits KrF laser light at the tested thickness of 20 mil.

The mechanism by which the back side cleaning removes undesired material from the front surface is unclear. One possibility is a photon/phonon interaction. It is known that a phonon field can be generated in a substrate in the direction of an applied laser field. Phonons can vibrate the bonds in covalent or ionic, as well as amorphous or crystalline solid structures. At a given frequency, it is believed that these vibrations can transfer sufficient energy to break bonds between desired and undesired material. The strength of the phonons may be enhanced by the surface crystal interface, thin film coatings on the surface, and the nature of the undesired material. Some background theoretical references on phonons are A. Neubrand and P. Hess, "Laser generation and detection of surface acoustic waves: elastic properties of surface layers," *Journal of Applied Physics*, vol. 71 (1) (1992), pp. 227–38; R. Hrovatin and J. Mozina, "Optical probing of laser induced surface waves in a transparent plate," *Journal of Applied Physics*, vol. 71 (12) (1992) pp. 6192–6194; and P. Knipp, "Phonons on stepped surfaces," *Physics Review B., Condensed Matter*, vol. 43 (15) pp. 6908–23. compared to nitrogen.

9. Enhancement of Chemisorption

As described in the '968 patent, thin film growth on semiconductor surfaces (such as by chemisorption of organometallic film on a silicon oxide substrate) can be enhanced by pretreating the substrate by irradiating the treatment surface with energetic photons in the presence of a flowing inert gas (in accordance with the method disclosed and claimed therein) to remove carbon contaminants, which would otherwise reduce the conductivity or insulating properties of the film. The thin films can also be removed by the same treatment. Such surface preparation and removal, although under high vacuum conditions rather than in the presence of a flowing gas, was subsequently reported for several organosilane films on glass and fused silicon slides. Dulcey et al, "Deep UV Photochemistry of Chemisorbed Monolayers: Patterned Coplanar Molecular Assemblies" *Science* Vol. 252, 551–554 (April 1991). As shown in the parent application, a variety of undesired materials can be removed from a variety of substrates, including metals, silicon-based materials, and oxides of both metals and silicon-based materials. Any such substrates can be treated to remove contaminants (undesired materials) from bond sites to which it is desired to chemisorb other, desired materials, by breaking the bonds between the undesired material and the substrate using the method of the invention and subsequently exposing the substrate to the desired material.

What is claimed is:

1. A method for selectively removing undesired material from a treatment surface of a substrate without affecting the physical properties of desired material to be left on the treatment surface adjacent to or underlying the undesired material, comprising the step of:

irradiating said undesired material and said desired material with polarized photons in a spatial and temporal concentration at said treatment surface sufficient to release the undesired material from the treatment surface and insufficient to alter the physical properties of the desired material.

2. The method of claim 1, wherein the desired material includes the substrate and a thin film upon the substrate.

3. The method of claim 2, wherein the thin film is selected from the group consisting of hafnium oxide, chrome, indium tin oxide, aluminum and nickel.

4. The method of claim 3, wherein the substrate is selected from the group consisting of quartz, borosilicate glass, silicon, steel and aluminum.

5. The method of claim 4, wherein the thin film is chrome and the substrate is quartz or borosilicate glass.

6. The method of claim 4, wherein the thin film is indium tin oxide and the substrate is quartz or borosilicate glass.

7. The method of claim 4, wherein the thin film is aluminum and the substrate is silicon.

8. The method of claim 4, wherein the thin film is hafnium oxide and the substrate is quartz or borosilicate glass.

9. The method of claim 4, wherein the thin film is nickel and the substrate is steel or aluminum.

10. The method of claim 1, further comprising the step of:

simultaneously introducing across said undesired material a flow of gas substantially inert to said substrate.

11. A method for selectively removing undesired material from a treatment surface of a substrate without affecting the physical properties of desired material to be left on the treatment surface adjacent to or underlying the undesired material, comprising the steps of:

polarizing laser light such that one of the s-component and p-component of the laser light substantially predominates over the other of the s-component and the p-component; and applying said polarized laser light to said undesired material and said desired material at an energy flux and power flux at said treatment surface sufficient to release the undesired material from the treatment surface and insufficient to alter the physical properties of the desired material.

12. The method of claim 11, wherein said laser light is generated by a pulsed KrF excimer laser.

13. The method of claim 11, further comprising the step of:

simultaneously introducing across said undesired material a flow of gas substantially inert to said substrate.

14. A method for selectively removing undesired material from a treatment surface of a substrate without affecting the physical properties of desired material to be left on the treatment surface adjacent to or underlying the undesired material, comprising the steps of:

irradiating said undesired material and said desired material with polarized photons at energy and power flux levels sufficient to break the internal bonds of the undesired material and insufficient to raise the temperature of the desired material to a level which would produce changes in the physical properties of the desired material.

15. The method of claim 14, further comprising the step of:

simultaneously introducing across said undesired material a flow of gas substantially inert to said substrate.

16. A method for selectively removing undesired material from a treatment surface of a piezoelectric substrate without affecting the physical properties of desired material to be left on the treatment surface adjacent to or underlying the undesired material, comprising the steps of:

polarizing laser light such that the p-component of the laser light substantially predominates over the s-component; and applying said polarized laser light to said treatment surface of said piezoelectric substrate at an energy flux and power flux sufficient to release the undesired material from the treatment surface and insufficient to alter the physical properties of the desired material.

17. The method of claim 16, wherein said piezoelectric substrate includes at least one of lithium tantalate and lithium niobate.

18. The method of claim 16, further comprising the step of:

simultaneously introducing across said undesired material a flow of gas substantially inert to said piezoelectric substrate.

* * * * *